(12) United States Patent
Zu et al.

(10) Patent No.: US 9,487,040 B2
(45) Date of Patent: Nov. 8, 2016

(54) METHODS OF PATTERNING A CONDUCTOR ON A SUBSTRATE

(71) Applicant: 3M INNOVATIVE PROPERTIES COMPANY, St. Paul, MN (US)

(72) Inventors: Lijun Zu, Woodbury, MN (US); Matthew H. Frey, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 189 days.

(21) Appl. No.: 14/560,748

(22) Filed: Dec. 4, 2014

(65) Prior Publication Data

US 2015/0086757 A1 Mar. 26, 2015

Related U.S. Application Data

(63) Continuation of application No. 13/848,162, filed on Mar. 21, 2013, now Pat. No. 8,932,475, which is a continuation of application No. 12/393,201, filed on Feb. 26, 2009, now Pat. No. 8,425,792.

(60) Provisional application No. 61/032,273, filed on Feb. 28, 2008.

(51) Int. Cl.
*B32B 3/00* (2006.01)
*B41M 5/52* (2006.01)
*B82Y 10/00* (2011.01)
(Continued)

(52) U.S. Cl.
CPC ............... *B41M 5/52* (2013.01); *B82Y 10/00* (2013.01); *B82Y 40/00* (2013.01); *G03F 7/0002* (2013.01); *G06F 3/041* (2013.01); *G06F 3/044* (2013.01); *H05K 3/0079* (2013.01); *H05K 3/061* (2013.01); *G06F 2203/04103* (2013.01); *G06F 2203/04112* (2013.01); *H05K 2201/0108* (2013.01); *H05K 2201/0133* (2013.01);
(Continued)

(58) Field of Classification Search
None
See application file for complete search history.

(56) References Cited

U.S. PATENT DOCUMENTS 4,087,625 A 5/1978 Dym et al.
5,113,041 A 5/1992 Blonder et al.
(Continued)

FOREIGN PATENT DOCUMENTS

EP 0 911 906 A2 4/1999
JP 2000-081510 3/2001
(Continued)

OTHER PUBLICATIONS

Michel et al., Sep. 2001, "Printing meets lithography: Soft approaches to high-resolution patterning", IBM J. Res. & Dev., vol. 45, pp. 697-719.*

(Continued)

*Primary Examiner* — Humera Sheikh
*Assistant Examiner* — Seth Dumbris
(74) *Attorney, Agent, or Firm* — Robert S. Moshrefzadeh

(57) ABSTRACT

A method of patterning a conductor on a substrate includes providing an inked elastomeric stamp inked with self-assembled monolayer-forming molecules and having a relief pattern with raised features. Then the raised features of the inked stamp contact a metal-coated visible light transparent substrate. Then the metal is etched to form an electrically conductive micropattern corresponding to the raised features of the inked stamp on the visible light transparent substrate.

6 Claims, 9 Drawing Sheets

(51) Int. Cl.
  *B82Y 40/00* (2011.01)
  *G03F 7/00* (2006.01)
  *G06F 3/044* (2006.01)
  *H05K 3/00* (2006.01)
  *H05K 3/06* (2006.01)
  *G06F 3/041* (2006.01)

(52) U.S. Cl.
  CPC .............. *H05K 2203/0108* (2013.01); *H05K 2203/0537* (2013.01); *Y10T 428/24802* (2015.01)

(56) References Cited

U.S. PATENT DOCUMENTS

| | | | |
|---|---|---|---|
| 5,126,007 | A | 6/1992 | Shmulovich |
| 5,386,219 | A | 1/1995 | Greanias et al. |
| 5,492,611 | A | 2/1996 | Sugama et al. |
| 5,512,131 | A | 4/1996 | Kumar et al. |
| 6,137,427 | A | 10/2000 | Binstead |
| 6,188,391 | B1 | 2/2001 | Seely et al. |
| 6,297,811 | B1 | 10/2001 | Kent et al. |
| 6,380,101 | B1 | 4/2002 | Breen et al. |
| 6,395,863 | B2 | 5/2002 | Geaghan |
| 6,472,804 | B2 | 10/2002 | Mueller et al. |
| 6,549,193 | B1 | 4/2003 | Huang et al. |
| 6,771,327 | B2 | 8/2004 | Sekiguchi |
| 6,775,907 | B1 | 8/2004 | Boyko et al. |
| 6,919,881 | B2 | 7/2005 | Chou |
| 7,129,935 | B2 | 10/2006 | Mackey |
| 7,180,508 | B2 | 2/2007 | Kent et al. |
| 7,196,281 | B2 | 3/2007 | Cok et al. |
| 7,202,859 | B1 | 4/2007 | Speck et al. |
| 7,265,686 | B2 | 9/2007 | Hurst et al. |
| 7,339,579 | B2 | 3/2008 | Richter et al. |
| 7,371,450 | B2 | 5/2008 | Arakawa et al. |
| 7,393,472 | B2 | 7/2008 | Lee et al. |
| 7,439,963 | B2 | 10/2008 | Geaghan et al. |
| 7,583,326 | B2 | 9/2009 | Cho et al. |
| 7,658,860 | B2 | 2/2010 | Nakagawa |
| 7,820,078 | B2 | 10/2010 | Louwet |
| 7,968,804 | B2 | 6/2011 | Frey et al. |
| 8,425,792 | B2 | 4/2013 | Zu et al. |
| 8,603,611 | B2 | 12/2013 | Wakabayashi et al. |
| 2002/0130605 | A1 | 9/2002 | Mueller et al. |
| 2002/0167619 | A1 | 11/2002 | Bietsch et al. |
| 2003/0047535 | A1 | 3/2003 | Schueller et al. |
| 2003/0067451 | A1 | 4/2003 | Tagg et al. |
| 2003/0170480 | A1* | 9/2003 | Gorman .................. C07K 7/00 428/573 |
| 2003/0222857 | A1 | 12/2003 | Abileah |
| 2003/0234770 | A1 | 12/2003 | MacKey |
| 2004/0012570 | A1 | 1/2004 | Cross et al. |
| 2004/0200575 | A1* | 10/2004 | Bietsch .................. B82Y 30/00 156/345.11 |
| 2004/0265550 | A1 | 12/2004 | Glatkowski et al. |
| 2005/0003590 | A1 | 1/2005 | Blees et al. |
| 2005/0041018 | A1 | 2/2005 | Philipp |
| 2005/0083307 | A1 | 4/2005 | Aufderheide et al. |
| 2005/0153078 | A1 | 7/2005 | Bentley et al. |
| 2005/0186405 | A1 | 8/2005 | Jeong et al. |
| 2006/0001800 | A1 | 1/2006 | Sanelle et al. |
| 2006/0007171 | A1 | 1/2006 | Burdi |
| 2006/0012575 | A1 | 1/2006 | Knapp et al. |
| 2006/0046078 | A1 | 3/2006 | Richter et al. |
| 2006/0097991 | A1 | 5/2006 | Hotelling et al. |
| 2007/0018076 | A1 | 1/2007 | Chen et al. |
| 2007/0059901 | A1 | 3/2007 | Majumdar et al. |
| 2007/0074914 | A1 | 4/2007 | Geaghan et al. |
| 2007/0128905 | A1 | 6/2007 | Speakman |
| 2007/0160811 | A1 | 7/2007 | Gaides et al. |
| 2007/0181878 | A1 | 8/2007 | Song et al. |
| 2007/0200099 | A1 | 8/2007 | Lee et al. |
| 2007/0236618 | A1 | 10/2007 | Maag et al. |
| 2007/0242054 | A1 | 10/2007 | Chang et al. |
| 2008/0041641 | A1 | 2/2008 | Geaghan et al. |
| 2008/0062148 | A1 | 3/2008 | Hotelling et al. |
| 2008/0095985 | A1 | 4/2008 | Frey et al. |
| 2008/0095988 | A1 | 4/2008 | Frey et al. |
| 2008/0150148 | A1 | 6/2008 | Frey et al. |
| 2008/0158183 | A1 | 7/2008 | Hotelling et al. |
| 2009/0002337 | A1 | 1/2009 | Chang |
| 2009/0159344 | A1 | 6/2009 | Hotelling |
| 2009/0160783 | A1 | 6/2009 | Yang |
| 2009/0163256 | A1 | 6/2009 | Wienke |
| 2009/0165296 | A1 | 7/2009 | Carmi |
| 2010/0220074 | A1 | 9/2010 | Irvin, Jr. et al. |
| 2011/0102361 | A1 | 5/2011 | Philipp |
| 2012/0046887 | A1 | 2/2012 | XiaoPing |

FOREIGN PATENT DOCUMENTS

| | | |
|---|---|---|
| JP | 2002-14772 | 1/2002 |
| JP | 2004-192093 | 7/2004 |
| JP | 2005-084475 | 3/2005 |
| JP | 2005-142175 | 6/2005 |
| JP | 2005-352638 | 12/2005 |
| JP | 2006-344163 | 12/2006 |
| JP | 2007-042887 | 2/2007 |
| JP | 2007-048278 | 2/2007 |
| KR | 10-0797092 B1 | 1/2008 |
| WO | WO 01/88998 | 11/2001 |
| WO | WO 2005/035438 A1 | 4/2005 |
| WO | WO 2005/114369 | 12/2005 |
| WO | WO 2005/121940 A2 | 12/2005 |
| WO | WO 2007/115032 A2 | 10/2007 |
| WO | WO 2009/089199 A2 | 7/2009 |

OTHER PUBLICATIONS

Love et al., Mar. 2005, "Self-Assembled Monolayers of Thiolates on Metals as a Form of Nanotechnology", Chem. Rev., vol. 105, pp. 103-1169.*

Lennhoff, "Laser Patterning For Touch Screen Manufacture", 2005, 3M Touch Systems, PWE1, (3 pages).

Love et al., "Self-Assembled Monolayers Of Thiolates On Metals As A Form Of Nanotechnology", *Chemical Reviews*, vol. 105, pp. 1103-1169 (2005).

Michel et al., "Printing Meets Lithography: Soft Approaches To High-Resolution Printing". Sep. 2001, IBM J. Res. & Dev. vol. 45, No. 5, pp. 697-719.

Ulman, "Formation and Structure of Self-Assembled Monolayers", *Chemical Reviews*, vol. 96, pp. 1533-1554 (1996).

WAYBACK Machine Internet Archive Entry of Conductive Inkjet Technology, Micro Fine Laser Curing:, Aug. 27, 2006.

U.S. Appl. No. 61/032,269, "Touch Screen Sensor Having Varying Sheet Resistance", filed Feb. 28, 2008.

Hui, et al., "Constraints on Microcontact Printing Imposed by Stamp Deformation," Langmuir, vol. 18, pp. 1394-1407 (2002).

Bietsch, et al., "Conformal contact and pattern stability of stamps used for soft lithography," Journal of Applied Physics, vol. 88, No. 7, pp. 4310-4318 (2000).

Delamarche, et al., "Stability of Molded Polydimethylsiloxane Microstructures," Advanced Materials, vol. 9, No. 9, pp. 741-746 (1997).

Odom, et al., "Improved Pattern Transfer in Soft Lithography Using Composite Stamps," Langmuir, vol. 18, pp. 5314-5320 (2002).

Sharp, et al., "Effect of Stamp Deformation on the Quality of Microcontact Printing: Theory and Experiment," Langmuir, vol. 20, pp. 6430-6438 (2004).

Decre, et al., "Numerical and Experimental Study of Critical Roof Collapse Conditions in Soft Lithography," Langmuir, vol. 21, pp. 7971-7978 (2005).

Delamarche, et al., "Transport Mechanisms of Alkanethiols during Microcontact Printing on Gold," Journal of Physical Chemistry B, vol. 102, pp. 3324-3334 (1998).

Schmid et al., "Siloxane Polymers for High Resolution, High-Accuracy Soft Lithography", Macromolecules, vol. 33, pp. 3042-3049 (2000).

(56) References Cited

OTHER PUBLICATIONS

U.S. Appl. No. 61/032,273, "Methods of Patterning a Conductor on a Substrate", filed Feb. 28, 2008.
U.S. Appl. No. 61/085,496, "Touch Screen Sensor", filed Aug. 1, 2008.
U.S. Appl. No. 61/085,799, "Touch Sensors with Micro-conductors and Methods of Reducing Conductor Visibility", filed Aug. 1, 2008.
U.S. Appl. No. 61/085,764, "Touch Sensors with Micro-conductors and Methods of Making the Same", filed Aug. 1, 2008.
U.S. Appl. No. 61/076,731, "Method of Forming a Microstructure", filed Jun. 30, 2008.
U.S. Appl. No. 61,076,736, "Method of Forming a Patterned Substrate", filed Jun. 30, 2008.

* cited by examiner

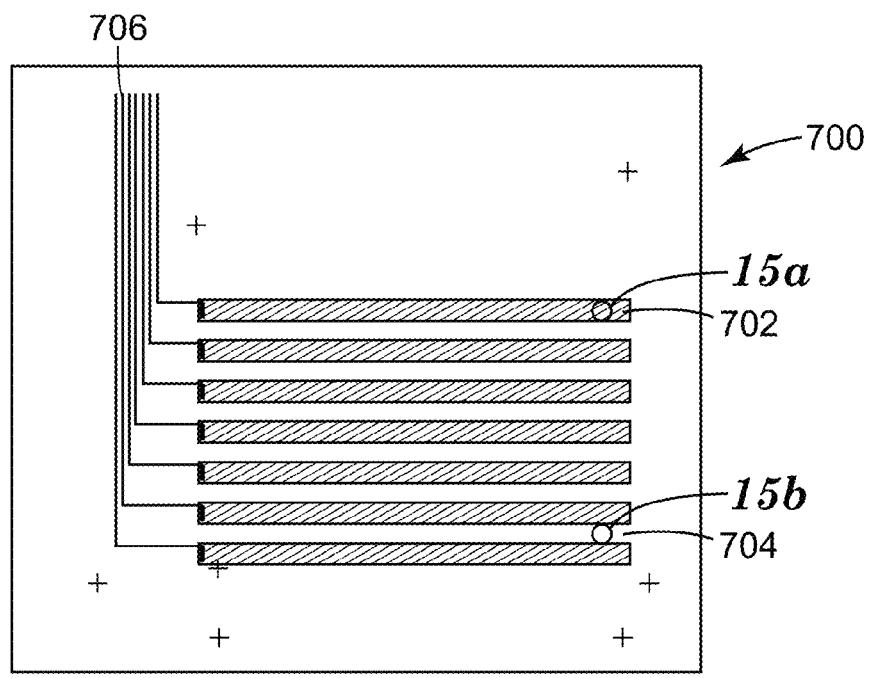
*Fig. 15*
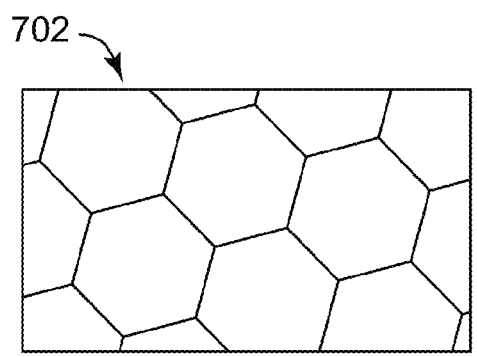 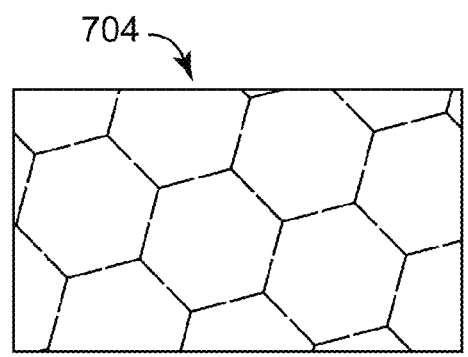
*Fig. 15a*  *Fig. 15b*

METHODS OF PATTERNING A CONDUCTOR ON A SUBSTRATE

BACKGROUND

There are numerous methods for patterning metals on surfaces, many of which are widely practiced commercially, including for example photolithography with etching or with plating, inkjet printing, screen-printing, and laser patterning. At the same time, there are many other unique methods that to date have failed to displace the incumbent processes commercially, for example due to lack of a true advantage or due to significant technical barriers to implementation. Significant technical barriers have impeded the commercialization of microcontact printing in the etch-patterning of metals.

Microcontact printing is the stamping or rotary printing of self-assembled monolayer (SAM) patterns on substrate surfaces. The approach exhibits several technologically important features, including the ability to be carried out for very fine scale patterns (e.g., feature size of one tenth of a micrometer) and with the extension of the patterned monolayer to the patterning of metals, ceramics, and polymers. Notwithstanding these features, the method has been revealed through extensive research to pose significant challenges related to pattern geometry flexibility and to scale-up. By pattern geometry flexibility, what is meant is the ability to apply a method of patterning to a wide range of pattern geometries. For example, in the art it is known that microcontact printing patterns with widely spaced features leads to stamp deformation, including roof collapse, which leads to unacceptable pattern distortion and artifacts.

These issues have led to the engineering of composite stamps with complicated constructions, usually comprising very stiff or very thin layers of the elastomer stamp material, or sometimes including mounting of the stamp on supports or backplanes with specified properties. In other approaches, stamps with significant relief have been proposed, leading to challenges in mastering and printing. Often, the material changes or stamp construction or support measures lead to challenges in generating an inked stamp that can be used to print patterns efficiently, for example with high throughput and at competitive cost. Thus, in order to avoid the negative ramifications and complications of extensive stamp material substitutions or multilayer stamp construction, there is a need in the art to define pattern geometries that are more compatible with standard stamp materials and low levels of stamp relief.

As another example, in the art it is known that kinetic aspects of the process can substantially constrain the range of SAM pattern geometries that can be microcontact printed effectively and efficiently. The kinetic phenomena that govern successful microcontact printing of SAM's include, for example, bulk diffusion of SAM-forming molecules in the stamp, surface diffusion of the same along the stamp, surface diffusion of the same along the substrate, surface diffusion of the same along the SAM itself, interfacial transport of the same at the stamp-substrate interface, and reaction kinetics for the SAM-forming molecule with the substrate surface. The convolution of these kinetic factors makes the ability, let alone the sufficient optimization for commercialization, of microcontact printing to generate any particular pattern uncertain.

Another important challenge in microcontact printing relates to printing features of different scale simultaneously. Owing to the aforementioned (but not entirely understood) kinetic factors, it is unknown whether particular combinations of features sizes and spacings can be printed effectively and with useful speeds. No obvious and practical condition exists for printing alkanethiols to form both small and large features at the same time while maintaining the accuracy of the former.

Another important but unpredictable factor that influences whether a particular metal pattern can be successfully generated under a given set of printing and etching conditions is the surface onto which the SAM is printed, for example as determined by a substrate onto which the metal is deposited. Factors such as surface roughness and readily achievable cleanliness can vary substantially from one substrate type to the next (for example, polymer films as opposed to semiconductor wafers) and thus impacts the ability or conditions under which a metal pattern can be generated thereon.

Thus, there is a need in the art for combinations of pattern geometries and microcontact printing conditions, including ink formulation and stamp inking procedures, that allow for the effective and efficient etch-patterning of metal micropatterns, on commercially viable substrates for various applications.

BRIEF SUMMARY

The present disclosure relates to methods of patterning conductors on a substrate.

In a first embodiment, a. method of patterning a conductor on a substrate includes providing an inked elastomeric stamp inked with self-assembled monolayer-forming molecules and having a relief pattern with raised features. The relief pattern having a low density region measuring at least 5 square millimeters ($mm^2$). The low density region includes an average area density value of raised features between 0.5 to 10%, linear segments having a width value between 0.5 to 25 micrometers ($\mu m$), and a distance value between adjacent raised features of less than 1 mm. Then the raised features of the inked stamp contact a metal-coated visible light transparent substrate. Then the metal is etched to form an electrically conductive micropattern corresponding to the raised features of the inked stamp on the visible light transparent substrate.

In another embodiment, a method of patterning a conductor on a substrate includes providing a metal-coated visible light transparent substrate having a relief pattern with raised features, the relief pattern having a low density region measuring at least 5 $mm^2$. The low density region includes an average area density value of raised features between 0.5 to 10%, linear segments having a width value between 0.5 to 25 $\mu m$, and a distance value between adjacent raised features of less than 1 mm. Then an inked elastomeric stamp inked with self-assembled monolayer-forming molecules contacts the metal-coated visible light transparent substrate. As used herein "contacts" encompasses direct contact as well as a small separation such as an ink thickness. Then the metal is etched to form an electrically conductive micropattern on the visible light transparent substrate raised features.

In a further embodiment, a method of patterning conductors on a substrate includes providing an inked stamp with a relief pattern with raised features. The inked stamp includes linear organosulfur self-assembled monolayer-forming molecules with chain length from 16 to 18 atoms at a concentration within the stamp of 1 to 10 millimolar (mM). The relief pattern has a low density region measuring at least 5 $mm^2$. The low density region includes an average area density value of raised features between 0.5 to 5%, linear segments having a width value from approximately 1 to 4

μm, and a distance value between adjacent linear segments of less than 500 μm. The relief pattern further includes a raised feature measuring at least 25 μm in width. Then the inked stamp contacts a metal-coated visible light transparent substrate for a contact time in a range from 0.5 to 10 seconds, thereby depositing a pattern of self-assembled monolayer. Then the metal is etched to form a transparent electrically conductive micropattern corresponding to the raised features of the inked stamp on the visible light transparent substrate. Various embodiments of the present invention are useful in applications such as touch screen sensors for displays, electromagnetic interference (EMI) shielding films, and transparent electrodes for electroluminescent, electrochromic or photovoltaic devices.

BRIEF DESCRIPTION OF THE DRAWINGS

The invention may be more completely understood in consideration of the following detailed description of various embodiments of the invention in connection with the accompanying drawings, in which:

FIGS. 15, 15a and 15b illustrate various portions of a first patterned substrate;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 5:
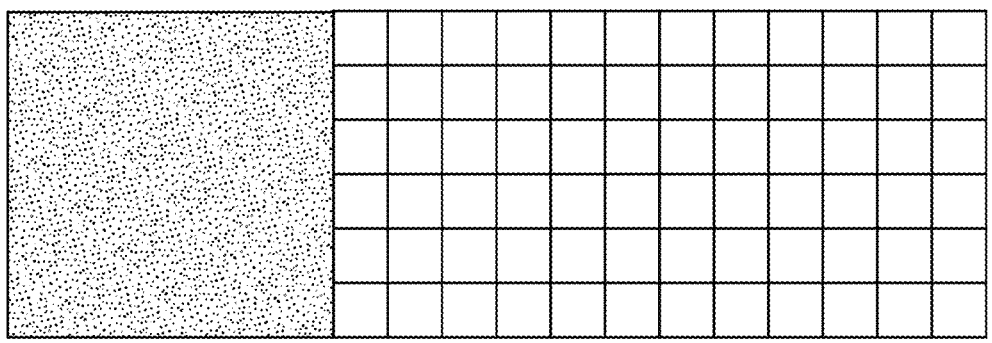
FIG. 5 illustrates an electrically conductive pattern comprising a low density micropattern region, the low density micropattern region includes 3 μm wide traces on a pitch of 200 μm in each of two orthogonal directions, leading to a fill factor for traces of approximately 3%, and a larger feature in the form of a continuous metal region measuring 1.2 mm by 1.2 mm.

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The use of numerical ranges by endpoints includes all numbers within that range (e.g., 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the context clearly dictates otherwise. As used in this specification and the appended claims, the term "or" is generally employed in its sense including "and/or" unless the context clearly dictates otherwise.

As used herein, "visible light transparent" refers to the level of transmission being at least 80% transmissive to at least one polarization state of visible light, where the % transmission is normalized to the intensity of the incident, optionally polarized light. It is within the meaning of visible light transparent for an article that transmits at least 60% of incident light to include microscopic features (e.g., dots, squares, or lines with minimum dimension, for example width, between 0.5 and 10 µm, or between 1 and 5 µm) that block light locally to less than 60% transmission (e.g., 0%); however, in such cases, for an approximately equiaxed area including the microscopic feature and measuring 1000 times the minimum dimension of the microscopic feature in width, the average transmittance is greater than 60%.

A polymeric "film" substrate is a polymer material in the form of a flat sheet that is sufficiently flexible and strong to be processed in a roll-to-roll fashion. By roll-to-roll, what is meant is a process where material is wound onto or unwound from a support, as well as further processed in some way. Examples of further processes include coating, slitting, blanking, and exposing to radiation, or the like. Polymeric films can be manufactured in a variety of thickness, ranging in general from about 5 µm to 1000 µm. In many embodiments, polymeric film thicknesses range from about 25 µm to about 500 µm, or from about 50 µm to about 250 µm, or from about 75 µm to about 200 µm. For films that include a relief structure on one or both major surfaces, what is meant by thickness of the film is the average thickness across the area of the film.

A "self-assembled monolayer" generally refers to a layer of molecules that are attached (e.g., by a chemical bond) to a surface and that have adopted a preferred orientation with respect to that surface and even with respect to each other. Self-assembled monolayers have been shown to cover surfaces so completely that the properties of that surface are changed. For example, application of a self-assembled monolayer can result in a surface energy reduction and allow selective etching of metal that is not coated with the self-assembled monolayer.

The present disclosure relates to methods of metal patterning based on microcontact printing and etching. As used herein, "metal" and "metalized" refers to a conductive material such as an elemental metal or alloy which is suitably conductive for the intended purpose. The improvements include preferred pattern geometries, and their combination with preferred inking and printing parameters. The pattern geometries, inking parameters, and printing parameters combine to define preferred operating windows for metal patterning, especially on polymer films. A first operating window has the advantage of efficiently and reproducibly generating patterns of metals with very low fill-factor comprising fine traces using standard stamp materials and easily achievable and manageable stamp relief. A second operating window has the advantage of efficiently and reproducibly generating patterns of metals with a first region having a very low fill-factor comprising fine traces and a second region being a larger feature (i.e., larger than the fine traces) using of standard stamp materials and easily achievable and manageable stamp relief. The windows also include printing times that are preferred for cost-effective use of equipment, but also practicality of implementation. While the present invention is not so limited, an appreciation of various aspects of the invention will be gained through a discussion of the examples provided below.

The ability to pattern conductive materials effectively, efficiently and reproducibly using microcontact printing and etching depends on the geometry of the pattern of raised features, due to a number of complicating factors. The complicating factors include the effects of the pattern of stamp raised features on i) the local pressure applied to the substrate in the contact areas of the stamp or plate, as defined by the raised features, ii) stamp collapse in areas of the relief pattern between the raised features, iii) buckling of the raised features, and iv) the effective amount of SAM-forming molecules within the stamp or plate materials, near to the different raised features.

These effects impact the quality of the microcontact printed pattern, in terms of i) desirably avoiding pinholes in the intended conductor regions after patterning, ii) desirably avoiding distortion of conductor regions due to stamp or plate feature buckling, and iii) desirably avoiding extraneous conductor deposits resulting from collapse of the stamp or plate in regions between intended conductor regions. The underlying phenomena and mechanisms that govern these effects of relief pattern geometry on the ability to pattern conductive materials effectively are complex and in some cases at odds with each other.

The application of greater force between the stamp or plate and the substrates, leading to greater local pressure in the regions of contact between the two, has been found to be helpful in general for transferring a monolayer of molecules that form the self-assembled monolayer that allows for etch-patterning of conductor regions without a high density of pinholes, but can lead to collapse of the stamp in regions between the raised features of the relief pattern. As another example, spacing of raised features close together has been found to be helpful for avoiding collapse of the stamp and the generation of unintended conductor regions between the raised features of the relief pattern, but as the features are made to be closer together, an apparent negative effect of pattern density on the availability of sufficient SAM-forming molecules from the stamp or plate leads to the printing of a SAM mask that is unable to give conductor regions after etching that are substantially free of pinholes. The same concern regarding having sufficient concentration of SAM-forming molecules to protect features in high density patterns also applies to the need to protect large features with printed SAM's during etching. And, importantly, at odds with the desire to have sufficient concentration of SAM-forming molecules in the stamp and sufficient stamping times to allow adequate SAM formation within the large feature regions is a negative effect that such parameters can have on feature size accuracy for smaller features. To be sure, there is a complex interplay between many factors in the microcontact print-patterning of conductors. Importantly, the effects listed and elaborated upon above become substantially more challenging to manage as one attempts to apply the method described above for microcontact printing and etching at higher and higher speed needed for commercial viability. Notwithstanding this complexity, it has been discovered that certain desirable conductor pattern geometries, as derived from stamp or printing plate relief pattern geometries, can be fabricated by microcontact printing and etching at attractive speeds.

We have discovered that certain two-dimensional pattern geometries for the raised features of microcontact printing stamps allow for the effective, efficient, and reproducible generation of etched metal patterns when the stamps are used to print SAM-based etch masks. The pattern geometries under the current invention may take an essentially infinite number of different forms, but they all are consistent with certain descriptions, as given below.

All of the patterns include a low density region. By low density, what is meant is that the area fraction of raised features for the stamp or the area fraction of metal remaining after pattern-wise etching from the substrate is low, as given below. The term low density refers to the pattern density, which is used interchangeably herein with fill factor or fill-factor. Low-density is used interchangeably with low density. The low density region in the pattern is at least 5 $mm^2$ in area, preferably at least 10 $mm^2$. In some embodiments the low density region is greater than 1 square centimeter ($cm^2$) in area, greater than 10 $cm^2$ in area, greater than 50 $cm^2$ in area, or even greater than 100 $cm^2$ in area.

In some embodiments, the pattern includes the low density region with no requirement for the presence or absence of any other types of regions. In other embodiments, the pattern includes the low density region together with a region that includes a larger pattern feature (e.g., a wide trace or contact pad, measuring at least 10 μm, preferably at least 25 μm in width, for example 100 to 1000 μm in width). As a further example of the latter, the pattern of raised features on the stamp (which defines the metal pattern after etching) may include larger raised features that are the same size as allowed for an entire low density region, for example, 5 $mm^2$ or larger. Such a raised feature would define a region in itself with a density or fill factor of 1, which is not low. The pattern of the stamp, and hence the metal after pattern-wise etching, is comprised of raised features that define a two-dimensional relief pattern. All points in the relief pattern that do not lie within a raised feature are described herein to be "non-raised points" in the relief pattern.

Geometries in low-density regions preferably include raised features in the form of non-parallel linear elements. By including non-parallel linear elements, what is meant is that the pattern includes linear elements where not all of the linear elements are parallel with each other. It has been found that geometries comprising non-parallel linear elements significantly increase the ease with which one can generate metal patterns having surprisingly low fill factor, for example less 10%, or less than 5%, or less than 4%, or less than 3%, or less than 2%, or less than 1%, or even lower, for example 0.5%. Although these fill factor values for patterns, or regions of patterns, are preferred, it is within the scope of the disclosure for the patterns to have fill factor greater than 5%, greater than 10%, or even greater than 15%. In some embodiments the fill factor within a low density region is between 0.5 and 20%, in some embodiments between 0.5 and 15%, in some embodiments between 0.5 and 10%, in some embodiments between 0.5 and 5%, in some embodiments between 0.5 and 4%, and in some embodiments between 1 and 3%.

The pattern of raised features for the stamp, and in turn the pattern of conductor elements after etching, in the low density region is also describable in terms of a distance value between adjacent features and adjacent elements. It is preferred that the distance value between all adjacent raised features of the stamp in the low density region be less than or equal to approximately 1 mm. It is more preferable in some embodiments that the distance value between all adjacent raised features be less than or equal to approximately 500 μm. However, it is within the scope of this disclosure for the distance value between adjacent features and adjacent elements to be greater than 1 mm, for example between 1 mm and 2 mm or between 1 mm and 5 mm. To determine the distance values between adjacent raised features in a low density region, one first identifies the adjacent raised features. Adjacent raised features are identified differently for a low density region comprising a two-dimensional mesh of raised linear features versus a low density region comprising isolated raised features. Considering first the case of a two-dimensional mesh of raised features (for example raised features that define a square mesh, a hexagonal mesh, or other polygonal mesh), adjacent raised features are defined with reference to the mesh cell that they define. For different mesh cell shapes, identification of adjacent raised features requires different rules. First, for a mesh cell in which the centroid of the open area of the cell lies within the open area (i.e., the cell has an interior centroid), the adjacent raised features for that cell are the raised features that intersect the shortest possible straight line that can be drawn through the centroid and that extends to two boundaries of the cell; and, the distance value between adjacent raised features for that cell is the length of the straight line. In the case just described, raised features other than those contacted by the straight line are not considered adjacent. Second, for a mesh cell in which the centroid of the open area of the cell lies outside the open area (i.e., the cell has an exterior centroid), the adjacent raised features for that cell are defined first by partitioning the cell area into the minimum number of sub-cell areas required for the sub-cell areas each to have their own centroid within their sub-cell area (i.e., each sub-cell area has an interior centroid). Then, for such a mesh cell, there are multiple pairs of adjacent raised features, with one pair corresponding to each sub-cell area. For each sub-cell area, the adjacent raised features for that sub-cell area are the raised features that intersect the shortest possible straight line that can be drawn through the centroid for that sub-cell area and that extends to two boundaries of the sub-cell area; and, the distance value between adjacent raised features for that sub-cell area is the length of the straight line. For low density regions comprising isolated raised features, adjacent raised features are more directly understood by those of ordinary skill in the art. They are pairs of raised features for which there is no other raised feature in the space between them. It has been discovered that preferred stamp relief pattern geometries for the low density region include raised features that define a two-dimensional mesh with cells having interior centroids and with the adjacent raised features for cells having a distance value between them that is less than or equal to approximately 1 mm, or less than or equal to approximately 500 μm.

It is preferred that the fill-factor of the relief pattern is uniform in the low-density region. To be more specific, in the low-density region, it is preferred that the density of raised features, expressed as the area fraction occupied by raised features in any portion of the region, not vary by more than a certain variability factor, expressed as percentage of the average density in the entire low-density region. Relevant sizes for the area portion include 1 $mm^2$, 2 $mm^2$, 5 $mm^2$, and 10 $mm^2$. In many embodiments, the variability factor is less than 75%, or less than 50%, or less than 25%, or less than 10%, or less than 5%, or even lower.

Figure 2:
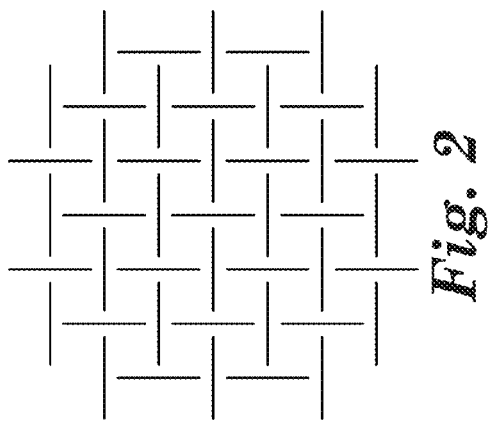
FIG. 2 illustrates a low density electrically conductive micropattern, the low density pattern includes 3 μm wide traces on a pitch of 200 μm in each of two orthogonal directions, with breaks as shown that measure approximately 10 μm, leading to a fill factor for traces of approximately 3%.
Figure 4:
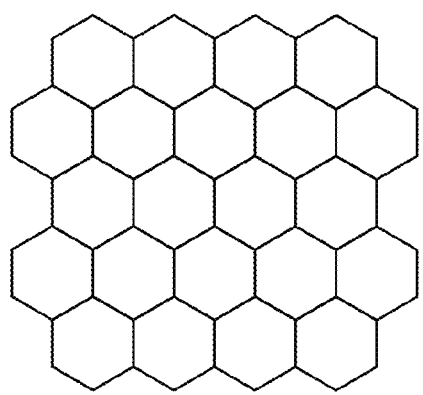
FIG. 4 illustrates a low density electrically conductive micropattern, the low density pattern includes 3 μm wide traces and apex to apex width for the hexagonal cells of approximately 175 μm, leading to a fill factor for traces of approximately 4%.
Figure 1:
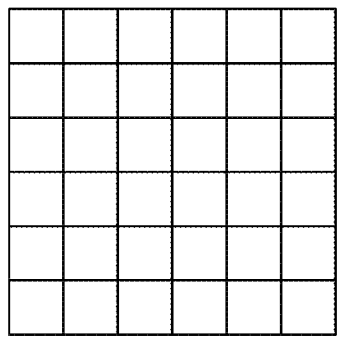
FIG. 1 illustrates a low density electrically conductive micropattern, the low density pattern includes 3 μm wide traces on a pitch of 200 μm in each of two orthogonal directions, leading to a fill factor for traces of approximately 3%.
Figure 3:
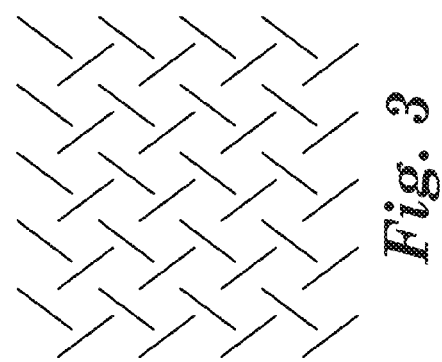
FIG. 3 illustrates a low density electrically conductive micropattern, the low density pattern measuring approximately 1.2 mm by 1.2 mm and includes 40 isolated segments of conductor measuring approximately 225 μm in length and approximately 3 μm in width, leading to a fill factor for traces of approximately 2%.

FIG. 1 through FIG. 5 provide a non-limiting set of useful electrically conductive micropatterns. FIG. 1 illustrates a low density electrically conductive micropattern, the low density pattern includes 3 μm wide traces on a pitch of 200 μm in each of two orthogonal directions, leading to a fill factor for traces of approximately 3%. FIG. 2 illustrates a low density electrically conductive micropattern, the low density pattern includes 3 μm wide traces on a pitch of 200 μm in each of two orthogonal directions, with breaks as shown that measure approximately 10 μm, leading to a fill factor for traces of approximately 3%. FIG. 3 illustrates a low density electrically conductive micropattern, the low density pattern measuring approximately 1.2 mm by 1.2 mm and includes 40 isolated segments of conductor measuring approximately 225 μm in length and approximately 3 μm in width, leading to a fill factor for traces of approximately 2%. FIG. 4 illustrates a low density electrically conductive micropattern, the low density pattern includes 3 μm wide traces and apex to apex width for the hexagonal cells of approximately 175 μm, leading to a fill factor for traces of approximately 4%. FIG. 5 illustrates an electrically conductive pattern comprising a low density micropattern region, the low density micropattern region includes 3 μm wide traces on a pitch of 200 μm in each of two orthogonal directions, leading to a fill factor for traces of approximately 3%, and a larger feature in the form of a continuous metal region measuring 1.2 mm by 1.2 mm.

With regard to the non-parallel linear elements, it has been found that preferred low density pattern geometries are characterized by having a plurality of the linear elements and no non-raised points more than a certain distance from a linear element for all directions (within plus or minus 10 degrees) around that point (herein called the "maximum separation distance" from a linear element). The limitation of plus or minus 10 degrees from a given direction acknowledges that it is within the scope of the disclosure for there to be minor openings between linear elements. Linear elements with minor openings are particularly useful in a low density region for supporting the stamp in portions of the region between contiguous elements, for example between meshes.

Figure 6:
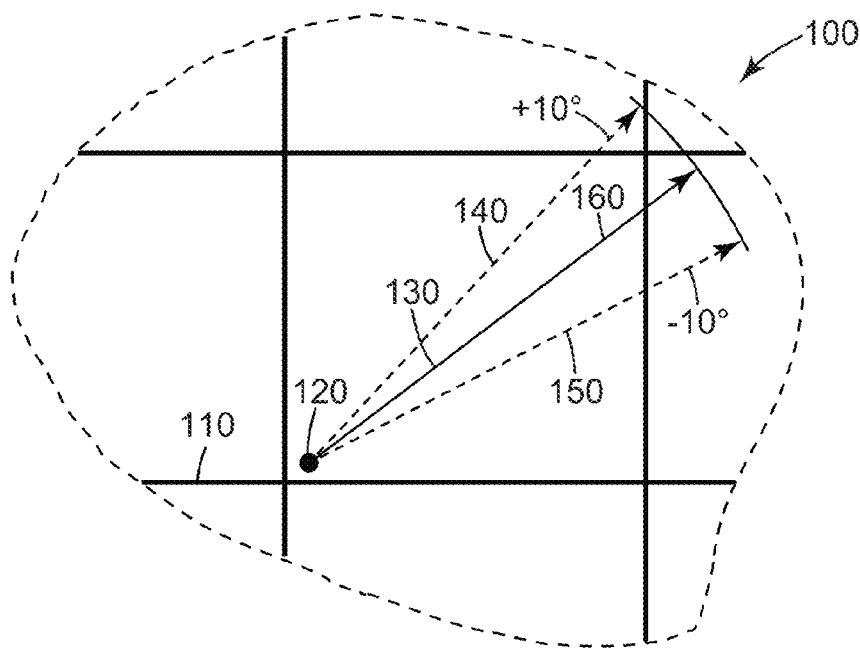
FIG. 6 illustrates a low density relief pattern for a stamp, the solid lines corresponding to linear raised features on the stamp surface and the dotted line outlining the region. The low density micropattern includes 3 μm wide raised linear features on a pitch of 700 μm, leading to fill factor for raised features of approximately 1%.

FIG. 6 illustrates a low density relief pattern region 100 for a stamp, the solid lines 110 corresponding to linear raised features on the stamp surface and the dotted line outlining the region. The low density micropattern comprises 3 μm wide raised linear features 110 on a pitch of 700 μm, leading to fill factor for raised features of approximately 1%. A non-raised point 120 is positioned in the space between raised features. A vector measuring 1 mm in magnitude 130, together with satellite vectors 140 and 150, and the area 160 which is bounded by the dashed line, can be swept through all angles (360 degrees) and observed to overlap with a raised linear element for all angles. Under such circumstances, the non-raised point is said to have a maximum separation distance from a raised linear feature of less than 1 mm for all directions.

Figure 7:
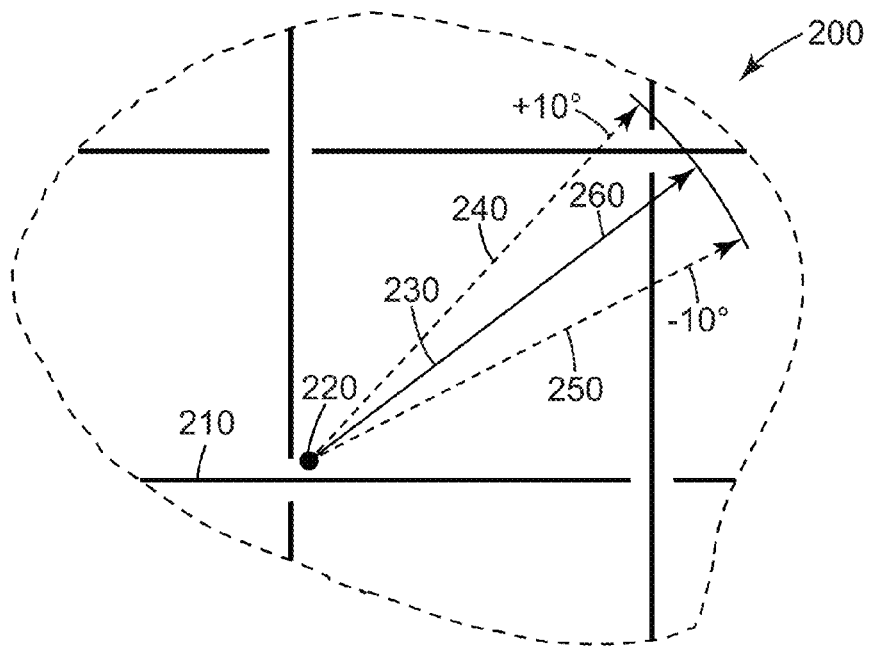
FIG. 7 illustrates a low density relief pattern for a stamp, the solid lines corresponding to linear raised features on the stamp surface and the dotted line outlining the region. The low density micropattern includes 3 μm wide raised linear features on a pitch of 700 μm, with breaks as shown that measure approximately 10 μm, leading to fill factor for raised features of approximately 1%.

FIG. 7 illustrates a low density relief pattern region 200 for a stamp, the solid lines 210 corresponding to linear raised features on the stamp surface and the dotted line outlining the region. The low density micropattern comprises 3 μm wide raised linear features 210 on a pitch of 700 μm, with breaks as shown that measure approximately 10 μm, leading to fill factor for raised features of approximately 1%. A non-raised point 220 is positioned in the space between raised features. A vector measuring 1 mm in magnitude 230, together with satellite vectors 240 and 250, and the area 260 which is bounded by the dashed line, can be swept through all angles (360 degrees) and observed to overlap with a raised linear element for all angles. Under such circumstances, the non-raised point is said to have a maximum separation distance from a raised linear feature of less than 1 mm for all directions.

Preferably, the maximum separation distance for all non-raised points to a linear elements, as described above is less than 1 mm, or less than 750 μm, or less than 500 μm, or less than 400 μm, or less than 300 μm, or less than 100 μm, or less than 50 μm, or even less. The linear elements have a long axis or arc length that is at least 3 times greater than their width, or more than 5, or greater than 10. In regions where electrical continuity is not required for the conductor elements that are derived from the raised features of the stamp, it will be understood by one of ordinary skill in the art that the benefit to printing that has been discovered for the specified placement and shape of linear elements could be met by the placement of very closely spaced more equiaxed elements, forming in essence a linear arrangement of tightly spaced elements. In the case of the latter, the linear arrangement of tightly spaced elements is considered a linear conductor element. The linear elements may be isolated from each other, but in some embodiments it is preferred that they are joined to create a network or mesh, for example a square mesh or a hexagonal mesh or other polygonal mesh. In many embodiments, the linear elements have a width less than or equal to approximately 25 μm, or less than or equal to approximately 10 μm, or less than or equal to approximately 5 μm, or less than or equal to approximately 2 μm. In some embodiments the linear elements have a width between 0.5 and 25 μm, in some embodiments between 0.5 and 10 μm, in some embodiments between 1 and 10 μm, in some embodiments between 1 and 5 μm, in some embodiments between 1 and 4 μm, in some embodiments between 1 and 3 μm, and in some embodiments between 2 and 3 μm.

For certain applications wherein a low fill-factor pattern of metal is desired, particularly on a polymer film substrate, it has been found that a stamp pattern comprising a two dimensional mesh of raised linear elements having width between 1 and 10 μm and no non-raised points with a maximum separation distance from a linear element of greater than 1 mm are advantageous for generating metal patterns with a fill-factor of between 0.5% and 5%, for example 2% or 3%. It has further been found that a stamp relief pattern comprising a two dimensional mesh of raised linear elements having a width between 2 and 5 μm and no non-raised points with a maximum separation distance from a linear element of greater than 750 μm are advantageous for generating metal patterns with a fill-factor of between 0.5% and 5%, for example 2% or 3%. It has further been found that a stamp relief pattern comprising a two dimensional mesh of raised linear elements having a width between 1 and 3 μm and no non-raised points with a maximum separation distance from a linear element of greater than 500 μm are advantageous for generating metal patterns with a fill-factor of between 0.5% and 5%, for example 2% or 3%.

The aforementioned stamp geometries are advantageous for managing the challenges of stamp collapse for standard stamp materials (for example, polydimethylsiloxane (PDMS) with a modulus between 0.5 and 5 MPa, for example PDMS sold under the product designation Sylgard 184 by Dow Corning, Midland, Mich.), especially for magnitudes of stamp relief that are i) convenient to generate, ii) do not present challenges of buckling for the raised features, and iii) that do not lead to long diffusion paths for ink molecules within the bulk of the stamp to reach printing surface.

For the aforementioned two dimensional pattern geometries, particularly convenient and useful magnitudes of stamp pattern relief lie between 0.5 and 10 μm, or between 0.75 and 5 μm, or between 1 and 2 μm. It is preferred to be able to use the aforementioned standard stamp materials, as opposed to other such materials for avoiding stamp collapse such as higher-modulus PDMS, because the standard materials provide relative advantages related to process throughput that relate to their advantageous transport properties and conformability of contact to non-smooth surfaces, for example metalized surfaces of substrates such as polymer films (as opposed to very smooth semiconductor wafers).

In some embodiments, in addition to the low density region described above, the two dimensional pattern of the stamp, and thus the finished conductor pattern on the substrate, includes a larger feature. The larger feature has a minimum dimension of at least 25 μm. Examples of larger features include lines with width (minimum dimension) of at least 25 μm and square pads with edge length (minimum dimension) of at least 25 μm. In the case of complicated geometries, for example wherein a contiguous conductor deposit may include fine scale elements and larger scale elements, it will be understood by one of ordinary skill in the art that the attachment of a fine scale element to a larger scale element does not reduce the minimum dimension of the larger scale element, as a feature itself, to that of the fine scale element. To be more clear, by way of an example, a contiguous conductor deposit on a substrate that includes a square pad measuring 1 mm by 1 mm and that also includes fine scale traces (e.g., 1 μm in width) attached to the pad, for example that form a low density mesh, is made up of a larger feature (the pad) and the low density mesh (i.e., the attachment of the 1 μm wide traces to the 1 mm by 1 mm wide pad does not cause the minimum dimension of the feature that includes the pad to be 1 μm and therefore not within the definition of a larger feature). In some embodiments, the larger feature has a minimum dimension of at least 50 μm, in some embodiments at least 100 μm, in some embodiments at least 200 μm, in some embodiments at least 500 μm, and in some embodiments at least 1 mm.

Preferred stamp inking procedures and parameters, as well as printing parameters, have been discovered for the cost-effective generation of metal patterns of the aforementioned geometries by microcontact printing followed by etching, particularly starting with metalized polymer films. More specifically, preferred molecules and their concentration in the stamp have been uncovered for the practical, high-speed printing of SAM-based etch masks. The molecules generate thiolate monolayers on the metal surface, and include alkylthiols, dialkyl disulfides, dialkyl sulfides, alkyl xanthates, dithiophosphates, and dialkylthiocarbamates. The molecules are characterized by a tail group or groups attached to a sulfur atom, wherein the tail group or groups have between 14 and 20 atoms along their backbone, preferably 16, 17, or 18 atoms. The atoms along the backbone are preferably carbon atoms. Preferably the ink solution comprises alkyl thiols such as, for example, linear alkyl thiols:

where n is the number of methylene units and X is the end group of the alkyl chain (for example, X=—CH$_3$, —OH, —COOH, —NH$_2$, or the like). Preferably, X=—CH$_3$ and n=15, 16, or 17, corresponding to chain lengths of 16, 17, or 18, respectively. Other useful chain lengths include 19 and 20. For linear molecules bearing a sulfur-containing head group for attachment to a metal, the chain length is determined as the number of atoms along the linear arrangement of bonded atoms between and including the atom that is bonded to the sulfur atom and final carbon atom in the linear arrangement. It is within the scope of this disclosure for the monolayer-forming molecule to be branched, for example with side groups attached to the linear arrangement of bonded atoms that define the chain. Useful end groups include those described, for example, in: (1) Ulman, "Formation and Structure of Self-Assembled Monolayers," *Chemical Reviews* Vol. 96, pp. 1533-1554 (1996); and (2) Love et al., "Self-Assembled Monolayers of Thiolates on Metals as a Form of Nanotechnology," *Chemical Reviews* Vol. 105, pp. 1103-1169 (2005). The SAM-forming molecules may be partially fluorinated or perfluorinated. Where particular SAM-forming molecules are called out herein as useful or preferred, it will be understood by one skilled in the art that other molecules which share the important printing attributes for the intended use with those molecules will be equivalently useful or preferred.

The SAM-forming molecules are present in the stamp, adjacent to the printing surface, preferably within a specified range of concentration. With respect to adjacency to the printing surface of the stamp, the concentration can be taken to be specified for the volume of the stamp defined as being within a distance of 10 μm from the stamping surface. The concentration in the stamp can be measured for example by microtoming a thin layer of elastomer from the printing surface of the stamp and then carrying out chemical analysis of the thin layer, for example with or without leaching the monolayer forming molecules out of the thin layer first. Useful analytical methods include mass spectrometry and spectroscopic methods such as nuclear magnetic resonance spectroscopy or infrared spectroscopy, as are known in the art.

With reference to the above pattern geometry descriptions for patterns comprising a low density region, generating the patterns as metal conductor deposits on substrates effectively, efficiently, and reproducibly using microcontact printing and etching has been found to be achievable for hexadecylthiol (HDT) concentrations in the stamp, adjacent to the printing surface as described above, between 0.05 and 5 mM, coupled with stamping times between 0.1 and 10 seconds. A preferred space within this window is defined by a concentration between 0.1 and 1 mM and a stamping time between 0.5 and 5 seconds. A more preferred space within this window is defined by a concentration between 0.1 and 0.5 mM and a stamping time between 0.5 and 5 seconds. Outside these windows, it was found that conductor patterns after etching were defective either in the form of poor etching selectivity or feature broadening that rendered the finished patterns not useful. Regarding the effectiveness, efficiency, and reproducibility of patterning, the aforementioned process window allows for stamping times that are short enough to be cost-effective but not so short as to be overly difficult to control. The window also defines a process space that was discovered to be reproducible with respect to sufficiently consistent feature size and overall pattern quality for rapid successive printing. Outside this window, other combinations of process parameters proved inadequate for allowing repeated printing up to 10 prints. In contrast, parameters within the window above allowed greater than 10 rapidly successive prints with excellent pattern quality and useful feature size accuracy. Coupled with the target stamping times, the concentration range described above was discovered to be useful for patterns comprising a low density region, for example a low density region comprising fine scale features as described above. Preferably, the pressure applied during printing, after application of the stamp to the substrate, is between 0 and 10 kilopascals, with respect to the actual area of contact between the stamp and the substrate. The process windows described above for hexadecylthiol and for patterns comprising a low density region, for example with fine features, is regarded as useful for other monolayer-forming molecules that are 16 atoms long (not including the head group, for example a thiol head group, not hydrogen atoms) or that share critical printing attributes with hexadecylthiol.

With reference to the above pattern geometry descriptions for patterns comprising a low density region, generating the patterns as metal conductor deposits on substrates effectively, efficiently, and reproducibly using microcontact printing and etching has been found to be achievable for octadecylthiol (ODT) concentrations in the stamp, adjacent to the printing surface as described above, of between 0.05 and 20 mM, coupled with stamping times between 0.1 and 10 seconds. A preferred space within this window is defined by a concentration between 0.5 and 10 mM and a stamping time between 0.5 and 5 seconds. A more preferred space within this window is defined by a concentration between 0.5 and 5 mM and a stamping time between 0.5 and 5 seconds. Outside these windows, it was found that conductor patterns after etching were defective either in the form of poor etching selectivity or feature broadening that rendered the finished patterns not useful. Regarding the effectiveness, efficiency, and reproducibility of patterning, the aforementioned process window allows for stamping times that are short enough to be cost-effective but not so short as to be overly difficult to control. The window also defines a process space that was discovered to be reproducible with respect to sufficiently consistent feature size and overall pattern quality for rapid successive printing. Outside this window, other combinations of process parameters proved inadequate for allowing repeated printing up to 10 prints. In contrast, parameters within the window above allowed greater than 10 rapidly successive prints with excellent pattern quality and useful feature size accuracy. Coupled with the target stamping times, the concentration range described above was discovered to be useful for patterns comprising a low density region, for example a low density region comprising fine scale features as described above. Preferably, the pressure applied during printing, after application of the stamp to the substrate, is between 0 and 10 kilopascals, with respect to the actual area of contact between the stamp and the substrate. The process windows described above for octadecylthiol and for patterns comprising a low density region, for example with fine features, is regarded as useful for other monolayer-forming molecules that are 18 atoms long (not including the head group, for example a thiol head group, not hydrogen atoms) or that share printing attributes important for the intended use with octadecylthiol. Octadecylthiol and like molecules are preferred to hexadecylthiol and like molecules.

With reference to the above pattern geometry descriptions for patterns comprising a low density region and a larger feature, generating the patterns as metal conductor deposits on substrates effectively, efficiently, and reproducibly using microcontact printing and etching has been found to be achievable for hexadecylthiol concentrations in the stamp, adjacent to the printing surface as described above, of between 0.5 and 5 mM, coupled with stamping times between 0.1 and 10 seconds. A preferred space within this window is defined by a concentration between 0.5 and 1 mM and a stamping time between 0.5 and 5 seconds. Outside these windows, it was found that conductor patterns after etching were defective either in the form of poor etching selectivity or feature broadening that rendered the finished patterns not useful. Regarding the effectiveness, efficiency, and reproducibility of patterning, the aforementioned process window allows for stamping times that are short enough to be cost-effective but not so short as to be overly difficult to control. The window also defines a process space that was discovered to be reproducible with respect to sufficiently consistent feature size and overall pattern quality for rapid successive printing. Outside this window, other combinations of process parameters proved inadequate for allowing repeated printing up to 10 prints. In contrast, parameters within the window above allowed greater than 10 rapidly successive prints with excellent pattern quality and useful feature size accuracy. Coupled with the target stamping times, the concentration range described above was discovered to be useful for patterns comprising a low density region, for example a low density region comprising fine scale features as described above. Preferably, the pressure applied during printing, after application of the stamp to the substrate, is between 0 and 10 kilopascals, with respect to the actual area of contact between the stamp and the substrate. The process windows described above for hexadecylthiol and for patterns comprising a low density region, for example with fine features, is regarded as useful for other monolayer-forming molecules that are 16 atoms long (not including the head group, for example a thiol head group, not hydrogen atoms) or that share critical printing attributes with hexadecylthiol.

With reference to the above pattern geometry descriptions for patterns comprising a low density region and a larger feature, generating the patterns as metal conductor deposits on substrates effectively, efficiently, and reproducibly using microcontact printing and etching has been found to be achievable for octadecylthiol concentrations in the stamp, adjacent to the printing surface as described above, of between 0.5 and 20 mM, coupled with stamping times between 0.1 and 10 seconds. A preferred space within this window is defined by a concentration between 0.5 and 10 mM and a stamping time between 0.5 and 5 seconds. A more preferred space within this window is defined by a concentration between 1 and 5 mM and a stamping time between 0.5 and 5 seconds. Outside these windows, it was found that conductor patterns after etching were defective either in the form of poor etching selectivity or feature broadening that rendered the finished patterns not useful. Regarding the effectiveness, efficiency, and reproducibility of patterning, the aforementioned process window allows for stamping times that are short enough to be cost-effective but not so short as to be overly difficult to control. The window also defines a process space that was discovered to be reproducible with respect to sufficiently consistent feature size and overall pattern quality for rapid successive printing. Outside this window, other combinations of process parameters proved inadequate for allowing repeated printing up to 10 prints. In contrast, parameters within the window above allowed greater than 10 rapidly successive prints with excellent pattern quality and useful feature size accuracy. Coupled with the target stamping times, the concentration range described above was discovered to be useful for patterns comprising a low density region, for example a low density region comprising fine scale features as described above. Preferably, the pressure applied during printing, after application of the stamp to the substrate, is between 0 and 10 kilopascals, with respect to the actual area of contact between the stamp and the substrate. The process windows described above for octadecylthiol and for patterns comprising a low density region, for example with fine features, is regarded as useful for other monolayer-forming molecules that are 18 atoms long (not including the head group, for example a thiol head group, not hydrogen atoms) or that share critical printing attributes with octadecylthiol. Octadecylthiol and like molecules are preferred to hexadecylthiol and like molecules.

The ranges of concentration, and in particular for the SAM-forming molecules noted above, were in part also determined based on the need to avoid undesirable precipitation of the SAM-forming molecules on the surface of the stamp or within the stamp. It was discovered that certain concentrations, in particular high concentrations (e.g., 10 mM octadecylthiol in PDMS) although useful for printing can develop undesirable precipitation during extended and repeated use, the focus of the present disclosure. This issue of precipitation is especially problematic for eicosanethiol (20 carbon chain thiol), although not to the extent that the molecule cannot be used.

The aforementioned specification of SAM-forming molecules and concentration, especially for the preferred molecules, lead to an inked stamp that is especially capable of generating SAM-based masks of the aforementioned geometries with high throughput, especially on metalized polymer film substrates. The inked stamps have been found to be preferred for stamping or printing the SAM masks at commercially attractive print times for the geometries noted, optimally addressing the need for adequate SAM perfection to be useful as an etch mask and limited SAM spreading, preferably for particular substrates, for example polymer film substrates. According to the invention, the time of contact between the stamp and the metal surface (print time) lies between 0.1 and 30 seconds, preferably between 0.1 and 10 seconds, more preferably between 0.5 and 5 seconds.

The above-described process of stamping or printing with the above-described stamp can be carried out with any level of pressure between the stamp and the substrate that does not result in collapse. Examples of useful levels of pressure include less than 100 kilopascals, less than 50 kilopascals, less than 25 kilopascals, or even less than 10 kilopascals. The methods described herein are particularly useful for generating metal patterns by microcontact printing without the application of significant pressure. Applying increased pressure can improve the quality of SAM transfer, and thus generation of a better etch mask, but can compromise pattern fidelity due to stamp distortion.

The inked stamp and the printing conditions described above are particularly useful for carrying out repeated stampings of SAM-based etch mask patterns of the aforementioned geometries. By repeated stampings, what is meant is that once the stamp is inked, the stamp can be used repeatedly to generate the printed etch mask on new metal surface regions, for example new pieces of metalized substrate. The inked stamps are useful for carrying out greater than 5, or greater than 10, or greater than 20, or greater than 30, or greater than 40, or greater than 50 prints without repeating the inking step. The time between prints for such repeated printing, using the aforementioned stamps, with their relief patterns and ink concentrations, is preferably short, for example less than 30 seconds, or less than 15 seconds, or less than 10 seconds, or less than 5 seconds.

For patterns including junctions between low density regions and larger features, wherein linear features or elements in the low-density region make contact to the larger features, some pattern geometries include widening the linear feature before it makes contact to the larger feature. For example, a 1 to 5 µm wide linear element making contact to a large feature can be tapered to down to such width over a length of 1 to 10 times its width, from the larger feature. The tapering can assist in maintaining effective patterning. For some inking and printing parameters, portions of such narrow linear elements making contact to large features can be inadequately protected by the printed SAM during etching, leading to degradation of the linear element near to the larger feature.

Useful visible light transparent substrates include polymeric films. Useful polymeric films include thermoplastic and thermoset polymeric films. Examples of thermoplastics include polyolefins, polyacrylates, polyamides, polyimides, polycarbonates, and polyesters. Further examples of thermoplastics include polyethylene, polypropylene, poly(methylmethacrylate), polycarbonate of bisphenol A, poly(vinyl chloride), polyethylene terephthalate, and poly(vinylidene fluoride).

A metal-coated visible light transparent substrate can include a polymeric film, described above, having an inorganic material coating (e.g., metallic coating) on the polymeric film substrate to support the self-assembled monolayer, and can in turn be patterned by etching. The inorganic coating can include, for example, elemental metal, metal alloys, intermetallic compounds, metal oxides, metal sulfides, metal carbides, metal nitrides, and combinations thereof. Exemplary inorganic surfaces for supporting self-assembled monolayers include gold, silver, palladium, platinum, rhodium, copper, nickel, iron, indium, tin, tantalum, as well as mixtures, alloys, and compounds of these elements. The inorganic coatings on the polymeric substrate can be any thickness such as, for example, from 1 to 3000 nanometers (nm). The inorganic material coating can be deposited using any convenient method, for example sputtering, evaporation, chemical vapor deposition, or chemical solution deposition (including electroless plating).

The advantageous pattern geometries, inking conditions, and printing conditions described above have been identified as such for particular metals to be patterned subsequently by etching. The preferred metals are silver, gold, and palladium, although it is within the scope of the invention to etch pattern other metals. The SAM masks generated according to the invention are particularly useful for etch patterning the aforementioned metals at thickness between 5 and 1000 nm, or between 10 and 500 nm, or between 15 and 200 nm, or between 20 and 100 nm. The metal can be deposited on a substrate, before patterning, by any known deposition method, including vapor phase methods such as sputtering or evaporation, or by solution methods such as electroless plating. The etching can be carried out using methods known in the art.

In some embodiments, the method for forming a metal pattern includes a reversal of the relief relationship between stamp or plate and substrate, versus the foregoing discussion. That is, in these embodiments, the relief pattern formerly described for the stamp as useful are characteristic of the substrate, and the stamp is essentially featureless. In all other aspects, including pattern geometry, metal, inking, and print time for example, these embodiments are the same as those described above for use of relief structured stamps or plates and flat substrates. An example of a useful metalized relief-structured substrate is a silver vapor-coated, microreplicated polymer film. A thiol-infused stamp (e.g., PDMS) or rotary printing plate, for example that includes no relief structure, can be used to transfer a self-assembled monolayer mask to the raised regions of the conductor-coated relief pattern of the substrate surface. In a subsequent step, the conductor is selectively etched from the regions complementary to the raised features of the relief pattern, yielding a conductor pattern according to the raised feature pattern.

Figure 13:
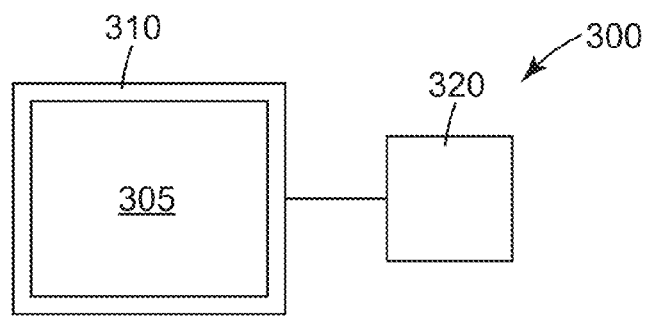
FIG. 13 illustrates a schematic diagram of a touch screen sensor.

FIG. 13 illustrates a schematic diagram of a touch screen sensor 300. The touch screen sensor 300 includes a touch screen panel 310 having a touch sensing area 305. The touch sensing area 305 is electrically coupled to a touch sensor drive device 320. The touch screen panel 310 is incorporated into a display device.

Figure 14:
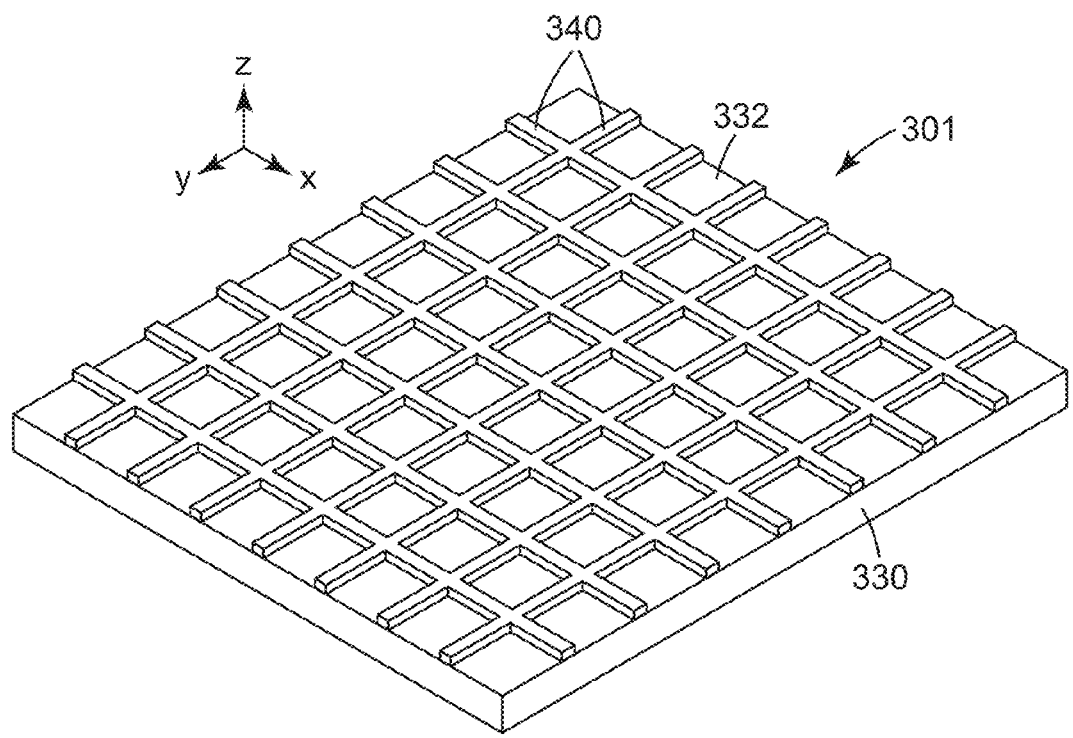
FIG. 14 illustrates a perspective view of a conductive visible light transparent region lying within a touch screen sensing area.

FIG. 14 illustrates a perspective view of a conductive visible light transparent region 301 lying within the touch sensing area 305. The conductive visible light transparent region 301 includes a visible light transparent substrate 330 and an electrically conductive micropattern 340 disposed on or in the visible light transparent substrate 330. The visible light transparent substrate 330 includes a major surface 332 and is electrically insulating. The visible light transparent substrate 330 can be formed of any useful electrically insulating material such as, for example, glass or polymer. Examples of useful polymers for light transparent substrate 330 include polyethylene terephthalate (PET) and polyethylene naphthalate (PEN). The electrically conductive micropattern 340 can be formed of a plurality of linear metallic features formed according to the method described herein.

FIG. 14 also illustrates an axis system for use in describing the conductive visible light transparent region 301 lying within the touch sensing area 305. Generally, for display devices, the x and y axes correspond to the width and length of the display and the z axis is typically along the thickness (i.e., height) direction of a display. This convention will be used throughout, unless otherwise stated. In the axis system of FIG. 14, the x axis and y axis are defined to be parallel to a major surface 332 of the visible light transparent substrate 330 and may correspond to width and length directions of a square or rectangular surface. The z axis is perpendicular to that major surface and is typically along the thickness direction of the visible light transparent substrate 330. A width of the plurality of linear metallic features that form the electrically conductive micropattern 340 correspond to an x-direction distance for the parallel linear metallic features that extend linearly along the y axis and a y-direction distance for the orthogonal linear metallic features correspond to a width of the orthogonal linear metallic features. A thickness or height of the linear metallic features corresponds to a z-direction distance.

In some embodiments, the conductive visible light transparent region 301 lying within the touch sensing area 305 includes two or more layers of visible light transparent substrate 330 having a conductive micropattern 340.

The conductive micropattern 340 is deposited on the major surface 332. Because the sensor is to be interfaced with a display to form a touch screen display, or touch panel display, the substrate 330 is visible light transparent and substantially planar. The substrate and the sensor may be substantially planar and flexible. By visible light transparent, what is meant is that information (for example, text, images, or figures) that is rendered by the display can be viewed through the touch sensor. The viewability and transparency can be achieved for touch sensors including conductors in the form of a deposited metal, even metal that is deposited with thickness great enough to block light, if the metal is deposited in an appropriate micropattern.

The conductive micropattern 340 includes at least one visible light transparent conductive region overlaying a viewable portion of the display that renders information. By visible light transparent conductive, what is meant is that the portion of the display can be viewed through the region of conductive micropattern and that the region of micropattern is electrically conductive in the plane of the pattern, or stated differently, along the major surface of the substrate onto which the conductive micropattern is deposited and to which it is adjacent. Preferred conductive micropatterns include regions with two dimensional meshes, for example square grids or regular hexagonal networks, where conductive traces define enclosed open areas within the mesh that are not deposited with conductor that is in electrical contact with the traces of the mesh. The open spaces and associated conductor traces at their edges are referred to herein as cells. Other useful geometries for mesh cells include random cell shapes and irregular polygons.

In one illustrative embodiment, a method of manufacturing a touch screen sensor is provided, the method including providing a metal-coated visible light transparent substrate having a relief pattern with raised features, the relief pattern having a low density region measuring at least 5 mm$^2$. The low density region has an average area density value of raised features between 0.5 to 10%, linear segments having a width value between 0.5 to 25 µm, and a distance value between adjacent raised features of less than 1 mm. The method includes contacting an inked elastomeric stamp inked with self-assembled monolayer-forming molecules to the metal-coated visible light transparent substrate and then etching the metal to form an electrically conductive micropattern on the visible light transparent substrate raised features.

In another illustrative embodiment, a method of patterning a conductor on a substrate is provided, the method including providing an inked stamp with a relief pattern with raised features, the inked stamp comprising linear organosulfur self-assembled monolayer-forming molecules with chain length from 16 to 18 atoms at a concentration within the stamp of 1 to 10 mM, the relief pattern having a low density region measuring at least 5 mm$^2$. The low density region has an average area density value of raised features between 0.5 to 5%, linear segments having a width value from approximately 1 to 4 µm, a distance value between adjacent raised features of less than 1 mm, and a raised feature measuring at least 25 µm in width. The method includes contacting the inked stamp to a metal-coated visible light transparent substrate, the contacting step having a contact time in a range from 0.5 to 10 seconds, thereby depositing a pattern of self-assembled monolayer. The method also includes etching the metal to form a transparent electrically conductive micropattern corresponding to the raised features of the inked stamp on the visible light transparent substrate.

In another illustrative embodiment, a method of patterning a conductor on a substrate is provided, the method including providing an inked stamp with a relief pattern with raised features, the inked stamp comprising linear organosulfur self-assembled monolayer-forming molecules with chain length from 16 to 18 atoms at a concentration within the stamp of 1 to 10 mM, the relief pattern having a low density region measuring at least 5 mm$^2$. The low density region has an average area density value of raised features between 0.5 to 5%, linear segments having a width value from approximately 1 to 4 µm, a distance value between adjacent linear segments of less than 1 mm, and a raised feature measuring at least 150 µm in width. The method includes contacting the inked stamp to a metal-coated visible light transparent substrate, the contacting step having a contact time in a range from 0.5 to 10 seconds, thereby depositing a pattern of self-assembled monolayer. The method also includes etching the metal to form a transparent electrically conductive micropattern corresponding to the raised features of the inked stamp on the visible light transparent substrate.

In another illustrative embodiment, a method of patterning a conductor on a substrate is provided, the method including providing an inked stamp with a relief pattern with raised features, the inked stamp comprising linear organosulfur self-assembled monolayer-forming molecules comprising octadecylthiol at a concentration within the stamp of 1 to 10 mM, the relief pattern having a low density region measuring at least 5 mm². The low density region has an average area density value of raised features between 0.5 to 5%, linear segments having a width value from approximately 1 to 4 µm, a distance value between adjacent linear segments of less than 1 mm, and a raised feature measuring at least 150 µm in width. The method includes contacting the inked stamp to a metal-coated visible light transparent substrate, the contacting step having a contact time in a range from 0.5 to 10 seconds, thereby depositing a pattern of self-assembled monolayer. The method also includes etching the metal to form a transparent electrically conductive micropattern corresponding to the raised features of the inked stamp on the visible light transparent substrate.

In another illustrative embodiment, a method of patterning a conductor on a substrate is provided, the method including providing an inked stamp with a relief pattern with raised features, the inked stamp comprising linear organosulfur self-assembled monolayer-forming molecules comprising octadecylthiol at a concentration within the stamp of 1 to 10 mM, the relief pattern having a low density region measuring at least 5 mm². The low density region has an average area density value of raised features between 0.5 to 5%, linear segments having a width value from approximately 1 to 4 µm, a distance value between adjacent linear segments of less than 1 mm, and a raised feature measuring at least 150 µm in width. The method includes contacting the inked stamp to a metal-coated visible light transparent substrate, the contacting step having a contact time in a range from 0.5 to 5 seconds, thereby depositing a pattern of self-assembled monolayer. The method also includes etching the metal to form a transparent electrically conductive micropattern corresponding to the raised features of the inked stamp on the visible light transparent substrate.

In another illustrative embodiment, a method of patterning a conductor on a substrate is provided, the method including providing an inked stamp with a relief pattern with raised features, the inked stamp comprising linear organosulfur self-assembled monolayer-forming molecules comprising octadecylthiol at a concentration within the stamp of 1 to 10 mM, the relief pattern having a low density region measuring at least 5 mm². The low density region has an average area density value of raised features between 0.5 to 5%, linear segments having a width value from approximately 1 to 4 µm, a distance value between adjacent linear segments of less than 1 mm, and a raised feature measuring at least 0.25 mm in width. The method includes contacting the inked stamp to a metal-coated visible light transparent substrate, the contacting step having a contact time in a range from 0.5 to 5 seconds, thereby depositing a pattern of self-assembled monolayer. The method also includes etching the metal to form a transparent electrically conductive micropattern corresponding to the raised features of the inked stamp on the visible light transparent substrate.

EXAMPLES

Stamp Fabrication

Figure 8:
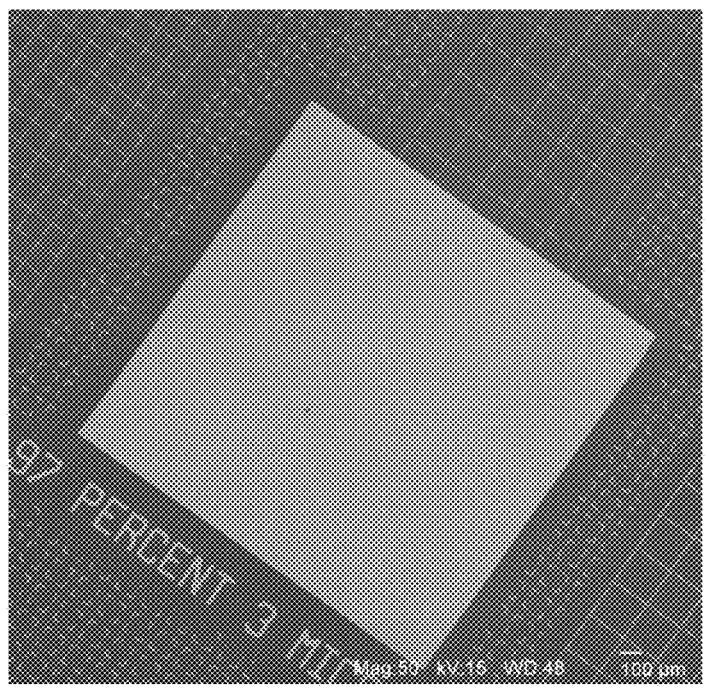
FIG. 8 is a scanning electron photomicrograph showing an electrically conductive pattern including a low density micropattern region with 3 μm wide conductive metal traces in the form of a square mesh with pitch of approximately 200 μm, leading to a 3% fill factor, together with a 2 mm by 2 mm region of continuous metal.
Figure 9:
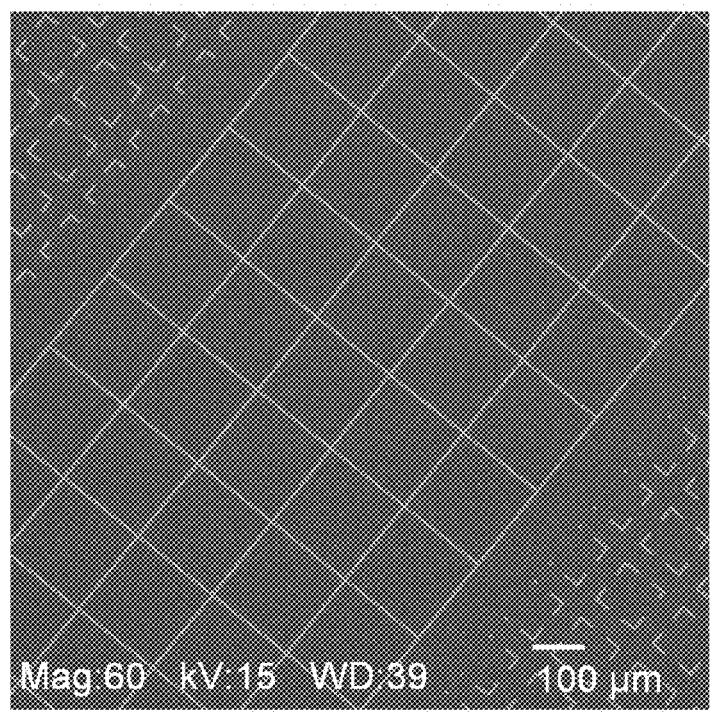
FIG. 9 is a scanning electron photomicrograph showing an electrically conductive pattern including a low density micropattern region with 5 μm wide conductive metal traces in the form of a square mesh with a 5% fill factor.
Figure 10:
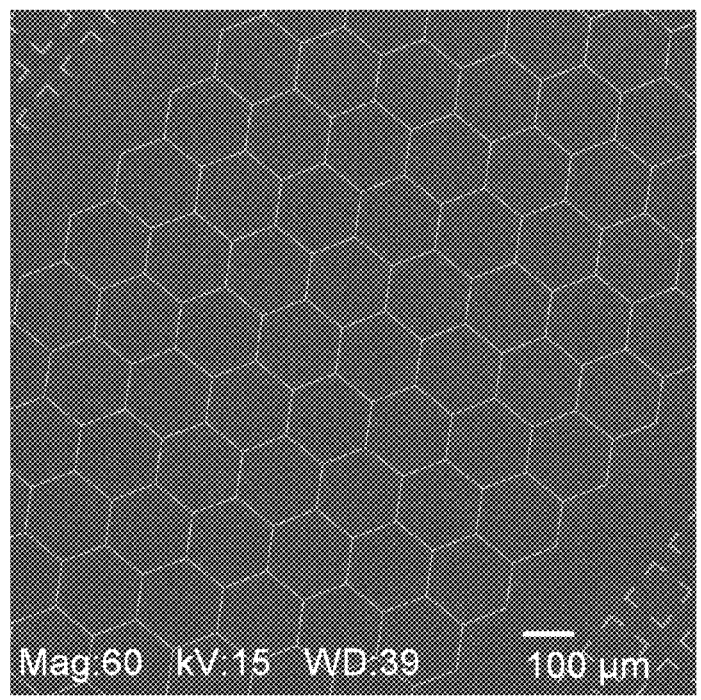
FIG. 10 is a scanning electron photomicrograph showing an electrically conductive pattern including a low density micropattern region with 3 μm wide conductive metal traces in the form of a hexagonal mesh with apex to apex width of approximately 175 μm, leading to a 4% fill factor.

Two different master tools for molding elastomeric stamps were generated by preparing patterns of photoresist (Shipley1818, Rohm and Haas Company, Philadelphia, Pa.) on 10 centimeter (cm) diameter silicon wafers. The different master tools were based on two different pattern designs, herein referred to as design "V1" and design "V2." The designs had some common elements and some differences. Both designs measured 5 cm by 5 cm in total area and included a 1 mm wide frame (open area in masks below and raised feature in the stamps below). Both designs also included a series of 20 low density mesh bars measuring approximately 33 mm in length and had width values ranging from 0.8 to 1.2 mm, the bars being terminated with 2 mm by 2 mm contact pads. In addition to the frame, the mesh bars, and the pads, the two designs included isolated features in the space between the mesh bars and between the mesh bars and the frame. The isolated features were variously sized and shaped forms with minimum dimension in the size range of 3 to 100 µm. The design V1 had an aggregate quantity of open area in the mask and thus raised area on the resulting stamp of 5.95 cm². The design V2 had an aggregate quantity of open area in the mask and thus raised area on the resulting stamp of 4.37 cm². To fabricate a master, the photoresist was spin-cast onto the wafer to a thickness of approximately 1.8 µm. For each master tool, a separate binary chrome photomask with openings in the chrome that define a low density pattern of line segments together with 2 mm by 2 mm square pads was used to expose the photoresist for patterning. After development of the photoresist, a master tool was provided that included a binary relief pattern comprising recessed features in the form of a low density area distribution of line segments and the pads. For both master tools, the portion of the pattern comprising the low density area distribution of line segments included different low density mesh geometries (for example, square grids) with 3 µm and 5 µm widths for the traces that define the meshes. The open area values for selected mesh regions were 90%, 93%, 95%, and 97% (i.e., 10, 7, 5, and 3% feature density, respectively). FIG. 8 is a scanning electron photomicrograph of a portion of a completed pattern, illustrating the arrangement of two-dimensional mesh regions of high open area and a 2 mm by 2 mm pad. FIG. 9 and FIG. 10 are scanning electron photomicrographs of a completed pattern (thin film silver on PET), illustrating the geometries of two low-density two-dimensional micropattern regions (square cell geometry with 95% open area and 5 µm wide traces, hexagonal cell geometry with 97% open area and three µm wide traces, respectively). An elastomeric stamp was molded against the master tool by pouring uncured polydimethylsiloxane (PDMS, Sylgard™ 184, Dow Corning, Midland, Mich.) over the tool to a thickness of approximately 3.0 mm. The uncured silicone in contact with the master was degassed by exposing to a vacuum, and then cured for 2 hours at 70° C. After peeling from the master tool, a PDMS stamp was provided with a relief pattern comprising raised features approximately 1.8 µm in height, in the pattern comprising the low density area distribution of line segments and the pads. The stamp was cut to a size of approximately 5 by 5 cm.

Inking

The stamp was inked by contacting its back side (major surface without relief pattern) to a solution of alkylthiol in ethanol for a prescribed time (inking time). The alkylthiol molecules used were hexadecylthiol ("HDT" H0068, TCI America, Wellesley Hills, Mass.) and octadecylthiol ("ODT" O0005, TCI AMERICA). The concentration of alkylthiol solution and the inking time were selected to achieve a target concentration of alkyl thiol in the PDMS stamp adjacent to the printing surface, as determined using a finite difference simulation computer program and measured diffusion coefficient values. For HDT, the diffusion coefficient value that was used for the simulations was 6.6E-7 cm$^2$ per second, a known value for HDT diffusion in ethanol-swelled PDMS. For ODT, two different values of diffusion coefficient were used for simulations, in order to bracket a range of expected thiol concentrations in the stamp adjacent to the printing surface. The two values for ODT were 4.0E-7 cm$^2$ per second, a known value for ODT diffusion in PDMS, and 6.6E-7 cm$^2$ per second, the known diffusion coefficient for HDT in ethanol-swelled. The values of the diffusion coefficient for ODT that were used are considered the lowest and the highest possible values that would describe the transport of octadecylthiol in the PDMS within the examples that follow. Thus, the calculations allowed for the bracketing of a range of expected concentration for the octadecylthiol adjacent to the printing surface in the examples. Thus, in the examples that follow, individual values of concentration are reported for hexadecylthiol and ranges of concentration values are reported for octadecylthiol.

Stamping

Metalized polymer film substrates were stamped after inking of the stamp. In each case, the film substrate was polyethyleneterephthalate "PET" (ST504, DuPont, Wilmington, Del.). The substrate was first coated by thermal evaporation (DV-502A, Denton Vacuum, Moorestown, N.J.) with metal thin films. For all examples, the substrate surface was first coated with 20 angstroms of chromium and then coated with 100 nm of silver or gold. After metallization, the films were stamped with inked stamps as described above. The metalized film substrates measured approximately 6 by 6 cm in area. For stamping, the metalized film was contacted to the stamp relief patterned-surface, which was face up, by first contacting an edge of the film sample to the stamp surface and then rolling the film into contact across the stamp, using a handheld rubber roller with diameter of approximately 3.5 cm. The rolling step required less than one second to execute. In the examples that follow, a stamping time is given, the stamping time corresponding to additional contact time between the substrate and the stamp after rolling the substrate onto the stamp. After the specified time had elapsed, the substrate was peeled from the stamp, a step that required less than 1 second. In some cases, as noted below, an additional mass was applied to the substrate-stamp assembly, after application of the substrate to the stamp and during stamping. The additional mass was a flat piece of glass weighing 120 grams plus a piece of flat ceramic tile with mass 140 grams, for a total of 260 grams. With respect to pattern design V1, with its contact area during stamping of 5.95 cm$^2$, 260 grams of applied mass corresponds to an applied pressure between the substrate and the raised features of the stamp of 4.3 kilopascals. With respect to pattern design V2, with its contact area during stamping of 4.37 cm$^2$, 260 grams of applied mass corresponds to an applied pressure between the substrate and the raised features of the stamp of 5.8 kilopascals.

Etching

After stamping, the metalized film substrate with printed pattern was immersed into an etchant solution for selective etching and metal patterning. For printed metalized film substrates bearing a gold thin film, the etchant comprised 1 gram of thiourea (T8656, Sigma-Aldrich, St. Louis, Mo.), 0.54 milliliter of concentrated hydrochloric acid (HX0603-75, EMD Chemicals, Gibbstown, N.J.), 0.5 milliliter of hydrogen peroxide (30%, 5240-05, Mallinckrodt Baker, Phillipsburg, N.J.), and 21 grams of deionized water. To pattern the gold thin film, the printed metalized film substrate was immersed in the etch solution for 50 seconds. For printed metalized film substrates bearing a silver thin film, the etchant comprised 0.45 grams of thiourea (T8656, Sigma-Aldrich, St. Louis, Mo.), 1.64 grams of ferric nitrate (216828, Sigma-Aldrich, St. Louis, Mo.), and 200 milliliter of deionized water. To pattern the silver thin film, the printed metalized film substrate was immersed in the etch solution for 3 minutes. After patterned etching of the gold or silver, residual chromium was etched using a solution of 2.5 grams of potassium permanganate (PX1551-1, EMD Chemicals), 4 grams of potassium hydroxide (484016, Sigma-Aldrich), and 100 milliliters of deionized water.

Characterization

After selective etching and metal patterning, the metal patterns were characterized using an optical microscope (Model BH-2 equipped with a DP12 digital camera, Olympus America, Center Valley, Pa.), scanning electron microscope (SEM, Model JSM-6400, JEOL Ltd, Tokyo, Japan), and resistance meter (GoldStar DM-313, LG Precision Co. Ltd., Korea). The microscopic techniques were used to determine the fidelity with which the intended pattern had been generated for the thin film metal after etching. The width of line features in the metal pattern was measured and compared with nominal width values of 3 µm and 5 µm. A dimension accuracy quality factor of 5, 4, 3, 2, or 1 was assigned, depending on whether the size of the printed feature exceeds the nominal size by 0 µm, approximately >0 to ≤0.5 µm, approximately >0.5 to ≤1.0 µm, approximately >1.0 to ≤1.5 µm, or >1.5 µm, respectively. The selectivity of etching was also judged using the microscopic techniques for the large pad regions (2 mm by 2 mm). A large feature selectivity quality factor of 1, 2, 3, 4, or 5 was assigned to describe the degree of selectivity that occurred in etch-patterning the larger area pads (5 is highest quality—essentially no pinholes or erosion of the pads during etching; 1 is lowest quality—the pad was largely etched away during the etch-patterning step). By selectivity, what is meant is the degree of protection and preservation of the metal, in the pad regions for example, during the etching removal of unprinted regions. For each quality factor above, it is preferable to achieve a value of 3, more preferably to achieve a value of 4, and even more preferable to achieve a value of 5. The resistance meter was used to measure the resistance of isolated mesh regions measuring approximately 1 mm by approximately 33 mm, between the large pads (2 mm by 2 mm). Based on this geometry of the mesh regions, a value of sheet resistance for each mesh was determined (equal to the measured resistance divided by 33 (squares)).

Example 1

Figure 11:
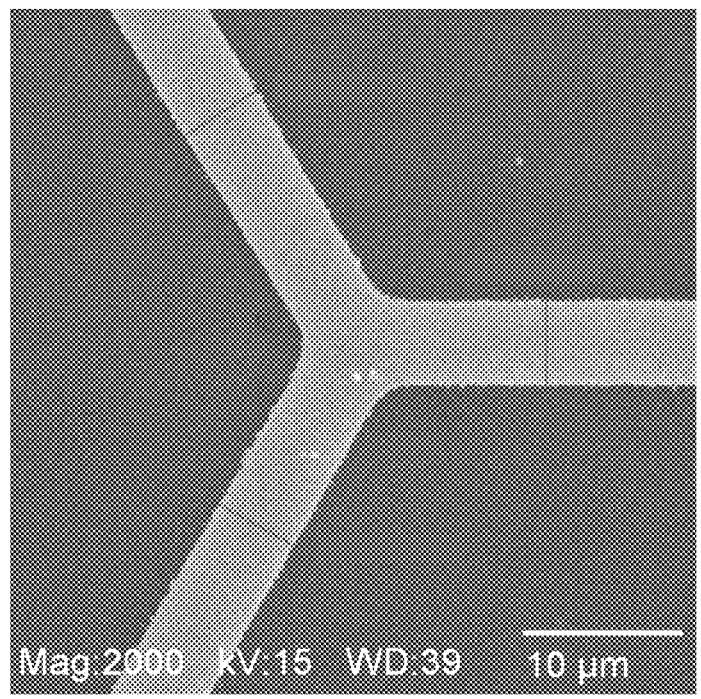
FIG. 11 is a scanning electron photomicrograph showing a small portion of an electrically conductive pattern including a low density micropattern region with approximately 5 μm wide conductive metal traces in the form of a hexagonal mesh with apex to apex width of approximately 175 μm, leading to a 6.5% fill factor (the image includes fine lines drawn across the three conductive line segments for the purpose of guiding the eye with respect to the width of the line segments)

An electrically conductive micropattern (V1) of thin film silver was fabricated and characterized according to the procedures described above. The ink solution comprised hexadecylthiol dissolved in ethanol at a concentration of 10 mM. The ink solution was contacted to the back side of the stamp for 2.3 hours, leading to a hexadecylthiol concentration in the PDMS adjacent to the printing or stamping surface of approximately 0.8 mM. The stamping time was 10 seconds and there was an applied mass of 260 g during stamping. FIG. 11 gives an SEM photomicrograph recorded from the completed thin film metal micropattern, derived from a low-density region comprising a hexagonal mesh with 97% open area and target trace width of 3 μm. The actual trace width measured over 5 μm.

Example 2

Figure 12:
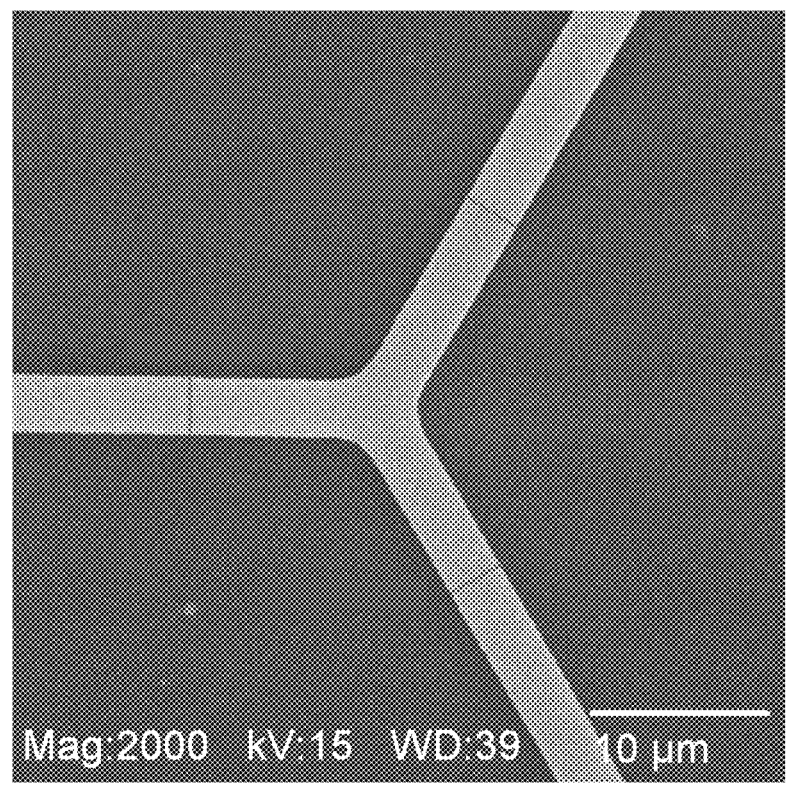
FIG. 12 is a scanning electron photomicrograph showing a small portion of an electrically conductive pattern including a low density micropattern region with 3 μm wide conductive metal traces in the form of a hexagonal mesh with apex to apex width of approximately 175 μm, leading to a 4% fill factor (the image includes fine lines drawn across the three conductive line segments for the purpose of guiding the eye with respect to the width of the line segments)

An electrically conductive micropattern (V2) of thin film silver was fabricated and characterized according to the procedures described above. The ink solution comprised hexadecylthiol dissolved in ethanol at a concentration of 10 mM. The ink solution was contacted to the back side of the stamp for 17.5 hours, leading to a hexadecylthiol concentration in the PDMS adjacent to the printing or stamping surface of approximately 5 mM. The stamping time was 5 seconds and there was no mass applied to the substate-stamp assembly after rolling application of the substrate to the stamp. FIGS. 8, 9, and 10 give SEM photomicrographs recorded from the completed thin film metal micropattern. FIG. 12 is another SEM photomicrograph of the completed thin film silver micropattern, derived from a low-density region comprising a hexagonal mesh with 97% open area and target trace width of 3 μm. The actual trace width measured approximately 3.2 μm.

Examples 3-42

Electrically conductive micropatterns of thin film silver were fabricated according to the process parameters listed in Table 1. Tables 2-7 give the quality factors assigned to selected examples, per the descriptions of quality factors given above. Examples that are not represented in Tables 2-7 are Examples 3, 4, 23 and 24, for which the stamping and etching steps yielded a very poorly defined pattern. For Example 38, a low density mesh region (square grid with 5 μm wide traces and 10% fill factor) of the conductor micropattern, measuring 1 mm in width and 33 mm in length and terminated at each end with a 2 mm by 2 mm pad, exhibited a resistance of 229 ohms. The resistance reading corresponds to a sheet resistance for the visible light transparent mesh region of 229/33=7 ohms per square. For Example 38, a low density mesh region (square grid with 3 μm wide traces and 5% fill factor) of the conductor micropattern, measuring 1 mm in width and 33 mm in length and terminated at each end with a 2 mm by 2 mm pad, exhibited a resistance of 419 ohms. The resistance reading corresponds to a sheet resistance for the visible light transparent mesh region of 419/33=12.7 ohms per square. For Example 38, a low density mesh region (square grid with 3 μm wide traces and 3% fill factor) of the conductor micropattern, measuring 1 mm in width and 33 mm in length and terminated at each end with a 2 mm by 2 mm pad, exhibited a resistance of 624 ohms. The resistance reading corresponds to a sheet resistance for the visible light transparent mesh region of 624/33=18.9 ohms per square. For Example 38, an approximately 1 cm diameter circular region that included the 3% and 5% fill factor mesh regions for which sheet resistance measurements are reported above was measured for its visible light transmittance. The measurement was made with an optical densitometer with photopic correction (Jonathan Allen, Titusville, N.J.). For the circular area just described the visible light transmittance was approximately 85%, as compared with a measurement of 88.7% for the base film substrate, suggesting an average fill factor over the 1 cm diameter circular area of approximately 4% (open area of approximately 96%).

Example 43

An electrically conductive micropattern (V1) of thin film gold was fabricated and characterized according to the procedures described above. The ink solution comprised octadecylthiol dissolved in ethanol at a concentration of 10 mM. The ink solution was contacted to the back side of the stamp for 4.5 hours, leading to an octadecylthiol concentration in the PDMS adjacent to the printing or stamping surface of approximately 0.8 mM. The stamping time was 2 seconds and there was no mass applied to the substate-stamp assembly after rolling application of the substrate to the stamp. A low density mesh region (square grid with 3 μm wide traces and 3% fill factor) of the conductor micropattern, measuring 1 mm in width and 33 mm in length and terminated at each end with a 2 mm by 2 mm pad, exhibited a resistance of 685 ohms. The resistance reading corresponds to a sheet resistance for the visible light transparent mesh region of 685/33=20.8 ohms per square.

TABLE 1

| Example number | Pattern | Thiol | Thiol concentration in ink solution (mM) | Contact time between stamp and ink solution (hours) | Thiol concentration in stamp adjacent to printing surface (mM) | Stamping time (seconds) | Applied mass during stamping (grams) |
|---|---|---|---|---|---|---|---|
| 3 | V2 | HDT | 10 | 1 | 0.0003 | 10 | 0 |
| 4 | V2 | HDT | 10 | 1 | 0.0003 | 10 | 260 |
| 5 | V2 | HDT | 10 | 2 | 0.042 | 10 | 0 |
| 6 | V2 | HDT | 10 | 2 | 0.042 | 10 | 260 |
| 7 | V2 | HDT | 10 | 2.3 | 0.082 | 1 | 0 |
| 8 | V2 | HDT | 10 | 2.3 | 0.082 | 5 | 0 |
| 9 | V2 | HDT | 10 | 2.3 | 0.082 | 10 | 0 |
| 10 | V2 | HDT | 10 | 2.3 | 0.082 | 10 | 260 |
| 11 | V2 | HDT | 10 | 3.5 | 0.4 | 1 | 0 |
| 12 | V2 | HDT | 10 | 3.5 | 0.4 | 10 | 0 |
| 13 | V2 | HDT | 10 | 3.5 | 0.4 | 10 | 260 |
| 14 | V2 | HDT | 10 | 4.5 | 0.8 | 1 | 0 |
| 15 | V2 | HDT | 10 | 4.5 | 0.8 | 5 | 0 |
| 16 | V2 | HDT | 10 | 4.5 | 0.8 | 10 | 0 |
| 17 | V2 | HDT | 10 | 4.5 | 0.8 | 10 | 260 |
| 18 | V2 | HDT | 10 | 17.5 | 5 | 5 | 0 |
| 19 | V2 | HDT | 50 | 4.5 | 10 | 10 | 260 |
| 20 | V2 | HDT | 50 | 24 | >25 | 0 | 0 |
| 21 | V2 | HDT | 50 | 24 | >25 | 1 | 0 |

TABLE 1-continued

| Example number | Pattern | Thiol | Thiol concentration in ink solution (mM) | Contact time between stamp and ink solution (hours) | Thiol concentration in stamp adjacent to printing surface (mM) | Stamping time (seconds) | Applied mass during stamping (grams) |
|---|---|---|---|---|---|---|---|
| 22 | V2 | HDT | 50 | 24 | >25 | 5 | 0 |
| 23 | V1 | ODT | 10 | 1 | 0.00001-0.001 | 10 | 0 |
| 24 | V1 | ODT | 10 | 1 | 0.00001-0.001 | 10 | 260 |
| 25 | V1 | ODT | 10 | 2 | 0.0075-0.082 | 10 | 0 |
| 26 | V1 | ODT | 10 | 2 | 0.0075-0.082 | 10 | 260 |
| 27 | V1 | ODT | 10 | 2.3 | 0.018-0.15 | 1 | 0 |
| 28 | V1 | ODT | 10 | 2.3 | 0.018-0.15 | 5 | 0 |
| 29 | V1 | ODT | 10 | 2.3 | 0.018-0.15 | 10 | 0 |
| 30 | V1 | ODT | 10 | 2.3 | 0.018-0.15 | 10 | 260 |
| 31 | V1 | ODT | 10 | 3.5 | 0.14-0.60 | 1 | 0 |
| 32 | V1 | ODT | 10 | 3.5 | 0.14-0.60 | 10 | 0 |
| 33 | V1 | ODT | 10 | 3.5 | 0.14-0.60 | 5 | 260 |
| 34 | V1 | ODT | 10 | 4.5 | 0.35-1.1 | 1 | 0 |
| 35 | V1 | ODT | 10 | 4.5 | 0.35-1.1 | 5 | 0 |
| 36 | V1 | ODT | 10 | 4.5 | 0.35-1.1 | 10 | 0 |
| 37 | V1 | ODT | 10 | 4.5 | 0.35-1.1 | 10 | 260 |
| 38 | V2 | ODT | 20 | 24 | >10 | 1 | 0 |
| 39 | V2 | ODT | 20 | 24 | >10 | 5 | 0 |
| 40 | V2 | ODT | 20 | 24 | >10 | 10 | 0 |
| 41 | V2 | ODT | 20 | 24 | >10 | 20 | 0 |
| 42 | V2 | ODT | 20 | 24 | >10 | 5 | 260 |

TABLE 2

Large feature selectivity quality factor (0 g applied mass)

| Concentration of hexadecylthiol in stamp adjacent to stamping surface (mM) | Stamping time (seconds) | | |
|---|---|---|---|
| | 1 | 5 | 10 |
| 0.042 | N//A | N//A | 1 |
| 0.082 | 2 | 2 | 2 |
| 0.4 | 2 | N//A | 3 |
| 0.8 | 3 | 5 | 5 |
| 5 | N//A | 5 | N//A |
| 10 | N//A | N//A | 5 |
| >25 | 5 | 5 | N//A |

TABLE 3

Low density region dimension accuracy quality factor (0 g applied mass)

| Concentration of hexadecylthiol in stamp adjacent to stamping surface (mM) | Stamping time (seconds) | | |
|---|---|---|---|
| | 1 | 5 | 10 |
| 0.042 | N/A | N/A | 5 |
| 0.082 | 5 | 5 | 5 |
| 0.4 | 5 | N/A | 5 |
| 0.8 | 5 | 3 | 3 |
| 5 | N/A | 4 | N/A |
| 10 | N/A | N/A | 1 |
| >25 | 1 | 1 | N/A |

TABLE 4

260 grams of applied mass (10 seconds stamping time)

| Concentration of hexadecylthiol in stamp adjacent to stamping surface (mM) | Large feature selectivity quality factor | Low-density region dimension accuracy quality factor |
|---|---|---|
| 0.042 | 1 | 5 |
| 0.082 | 2 | 4 |
| 0.4 | 4 | 4 |
| 0.8 | 5 | 1 |
| 10 | 5 | 1 |

TABLE 5

Large feature selectivity quality factor (0 g applied mass)

| Concentration of octadecylthiol in stamp adjacent to stamping surface (mM) | Stamping time (seconds) | | | |
|---|---|---|---|---|
| | 1 | 5 | 10 | 20 |
| 0.0075-0.082 | N/A | N/A | 1 | N/A |
| 0.018-0.15 | 2 | 2 | 2 | N/A |
| 0.14-0.60 | 3 | N/A | 3 | N/A |
| 0.35-1.1 | 3 | 4 | 5 | N/A |
| >10 | 5 | 5 | 5 | 5 |

TABLE 6

Low-density region dimension accuracy quality factor (0 g applied mass)

| Concentration of octadecylthiol in stamp adjacent to stamping surface (mM) | Stamping time (seconds) | | | |
|---|---|---|---|---|
| | 1 | 5 | 10 | 20 |
| 0.0075-0.082 | N/A | N/A | 5 | N/A |
| 0.018-0.15 | 5 | 5 | 5 | N/A |
| 0.14-0.60 | 5 | N/A | 5 | N/A |
| 0.35-1.1 | 5 | 5 | 5 | N/A |
| >10 | 4 | 5 | 3 | 2 |

TABLE 7

| | 260 grams of applied mass | | |
|---|---|---|---|
| Stamping time (seconds) | Concentration of octadecylthiol in stamp adjacent to stamping surface (mM) | Large feature selectivity quality factor | Low-density region dimension accuracy quality factor |
| 10 | 0.0075-0.082 | 1 | 5 |
| 10 | 0.018-0.15 | 2 | 5 |
| 5 | 0.14-0.60 | 4 | 4 |
| 10 | 0.35-1.1 | 5 | 3 |
| 5 | >10 | 5 | 1 |

Example 43

Figure 16:
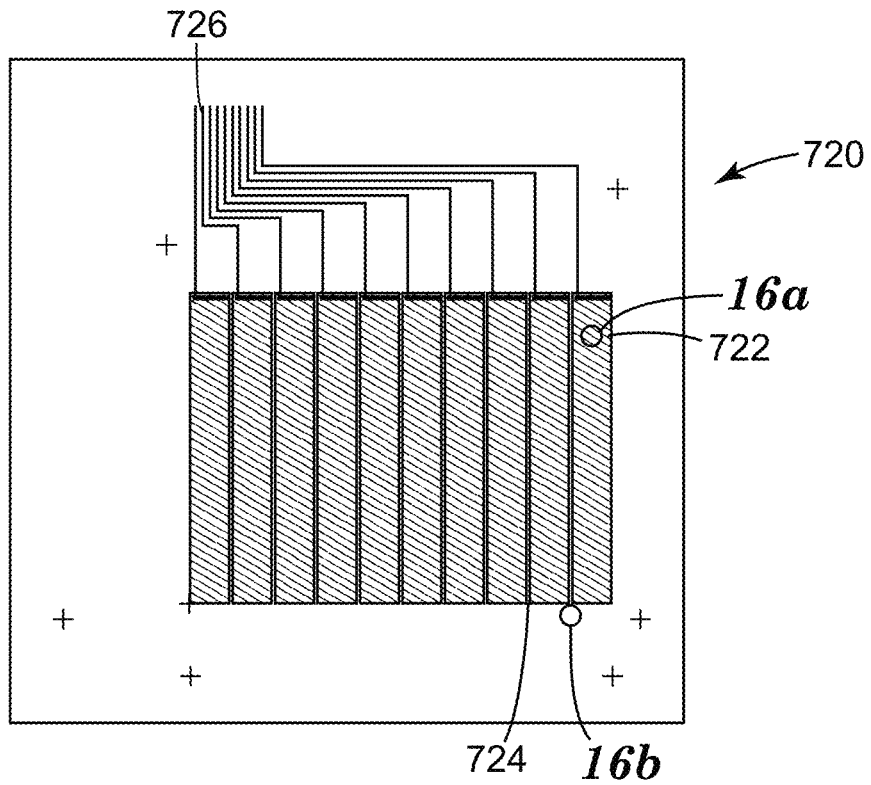
FIGS. 16, 16a, and 16b illustrate various portions of a second patterned substrate.
Figure 17:
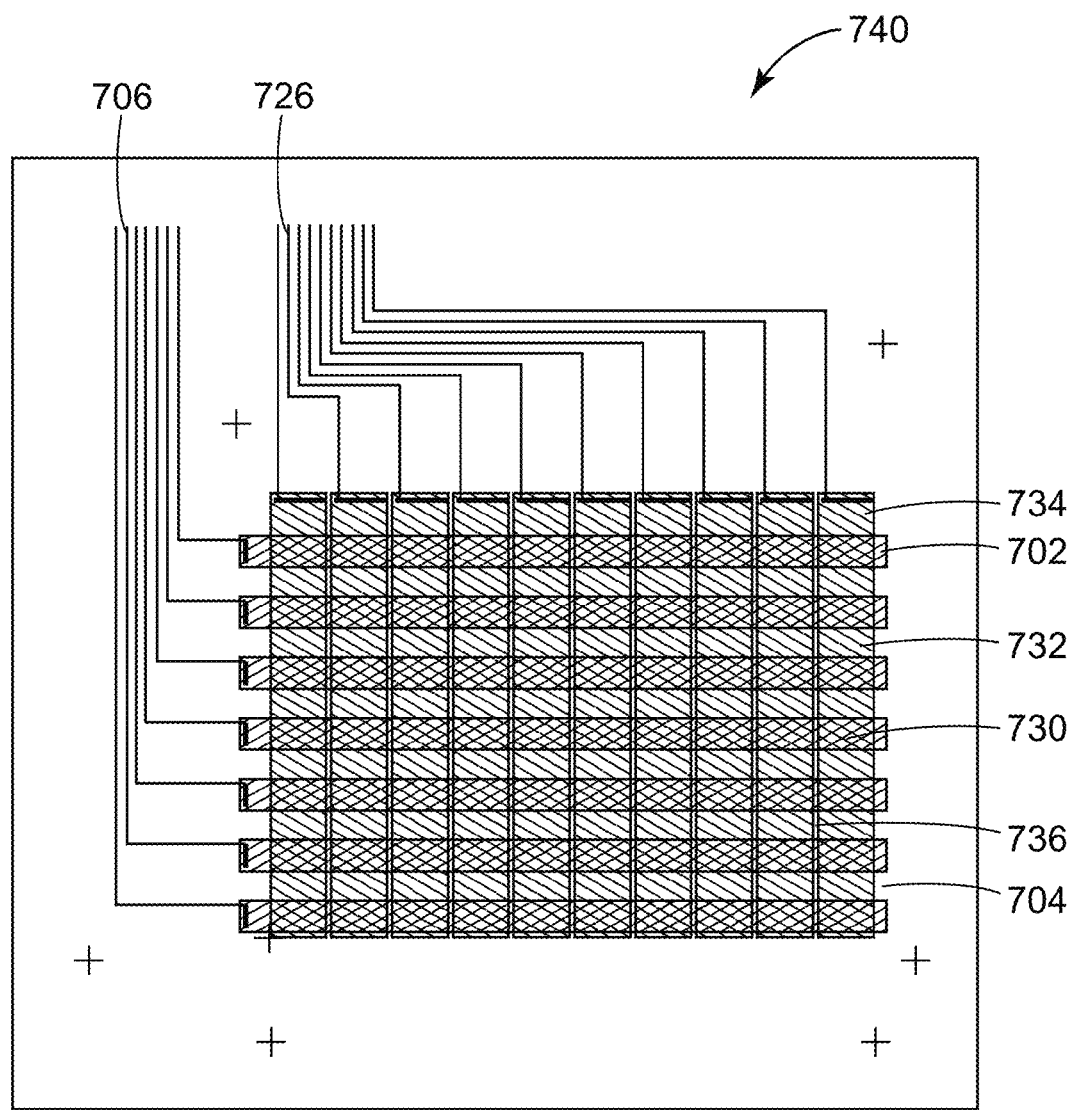
FIG. 17 illustrates a projected capacitive touch screen transparent sensor element constructed from the first and second patterned substrates of FIGS. 15 and 16.

A transparent sensor element was fabricated as generally shown in FIGS. 15, 16 and 17 using microcontact printing and etching, and combined with a touch sensor drive device. The device was then integrated with a computer processing unit connected to a display to test the device. The device was able to detect the positions of multiple single and or simultaneous finger touches, which was evidenced graphically on the display.

Formation of a Transparent Sensor Element

First Patterned Substrate

A first visible light substrate made of polyethylene terephthalate (PET) having a thickness of 125 µm was vapor coated with 100 nm silver thin film using a thermal evaporative coater to yield a first silver metalized film. The PET was commercially available as product number ST504 from E.I. du Pont de Nemours, Wilmington, Del. The silver was commercially available from Cerac Inc., Milwaukee, Wis. as 99.99% pure 3 mm shot.

A first poly(dimethylsiloxane) stamp, referred to as PDMS and commercially available as product number Sylgard 184, Dow Chemical Co., Midland, Mich., having a thickness of 3 mm, was molded against a 10 cm diameter silicon wafer (sometimes referred to in the industry as a "master") that had previously been patterned using standard photolithography techniques. The PDMS was cured on the silicon wafer at 65° C. for 2 hours. Thereafter, the PDMS was peeled away from the wafer to yield a first stamp having two different low-density regions with patterns of raised features, a first continuous hexagonal mesh pattern and a second discontinuous hexagonal mesh pattern. That is, the raised features define the edges of edge-sharing hexagons. A discontinuous hexagon is one that contains selective breaks in a line segment. The selective breaks had a length less than 10 µm. The breaks were designed and estimated to be approximately 5 µm. In order to reduce their visibility, it found that, preferably, the breaks should be less than 10 µm, more preferably, 5 µm or less, e.g., between 1 and 5 µm. Each raised hexagon outline pattern had a height of 2 µm, had 1% to 3% area coverage, corresponding to 97% to 99% open area, and line segments that measured from 2 to 3 µm in width. The first stamp also included raised features defining 500 µm wide traces. The first stamp has a first structured side that has the hexagonal mesh pattern regions and the traces and an opposing second substantially flat side.

The stamp was placed, structured side up, in a glass Petri dish containing 2 mm diameter glass beads. Thus, the second, substantially flat side was in direct contact with the glass beads. The beads served to lift the stamp away from the base of the dish, allowing the following ink solution to contact essentially all of the flat side of the stamp. A 10 millimolar ink solution of 1-octadecanethiol (product number C18H3CS, 97%, commercially available from TCI America, Portland, Oreg.) in ethanol was pipetted into the Petri dish beneath the stamp. The ink solution was in direct contact with the second substantially flat side of the stamp. After sufficient inking time (e.g., 3 hours) where the ink has diffused into the stamp, the first stamp was removed from the petri dish. The inked stamp was placed, structured side up, onto a working surface. The first silver metalized film was applied using a hand-held roller onto the now inked structured surface of the stamp such that the silver film was in direct contact with the structured surface. The metalized film remained on the inked stamp for 15 seconds. Then the first metalized film was removed from the inked stamp. The removed film was placed for three minutes into a silver etchant solution, which contained (i) 0.030 molar thiourea (product number T8656, Sigma-Aldrich, St. Louis, Mo.) and (ii) 0.020 molar ferric nitrate (product number 216828, Sigma-Aldrich) in deionized water. After the etching step, the resulting first substrate was rinsed with deionized water and dried with nitrogen gas to yield a first patterned surface. Where the inked stamp made contact with the silver of the first metalized substrate, the silver remained after etching. Thus silver was removed from the locations where contact was not made between the inked stamp and silver film.

FIGS. 15, 15a and 15b show a first patterned substrate 700 having a plurality of first continuous regions 702 alternating between a plurality of first discontinuous regions 704 on a first side of the substrate, which is the side that contained the now etched and patterned silver metalized film. The substrate has an opposing second side that is substantially bare PET film. Each of the first regions 702 has a corresponding 500 µm wide conductive trace 706 disposed at one end. FIG. 15a shows an exploded view of the first region 702 having a plurality of continuous lines forming a hexagonal mesh structure. FIG. 15b shows an exploded view of the first discontinuous region 704 having a plurality of discontinuous lines (shown as selective breaks in each hexagon) forming a discontinuous hexagonal mesh structure. Each mesh structure of regions 702 and 704 had 97% to 99% open area. Each line segment measured from 2 to 3 nm.

Second Patterned Substrate

The second patterned substrate was made as the first patterned substrate using a second visible light substrate to produce a second silver metalized film. A second stamp was produced having a second continuous hexagonal mesh pattern interposed between a second discontinuous hexagonal mesh pattern.

Figure 16A:
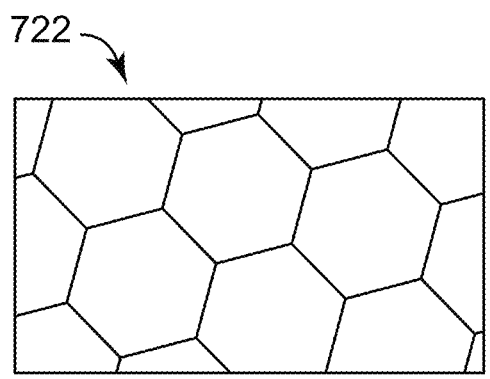
Figure 16B:
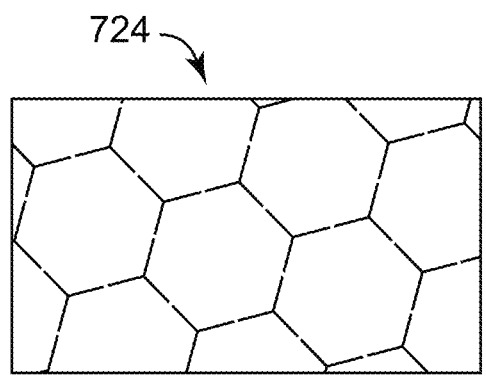

FIGS. 16, 16a and 16b show a second patterned substrate 720 having a plurality of second continuous regions 722 alternating between a plurality of second discontinuous regions 724 on a first side of the second substrate. Each of the second regions 722 has a corresponding 500 µm wide second conductive trace 726 disposed at one end. FIG. 16a shows an exploded view of one second region 722 having a plurality of continuous lines forming a hexagonal mesh structure. FIG. 16b shows an exploded view of one second discontinuous region 724 having a plurality of discontinuous lines (shown as selective breaks in each hexagon) forming a discontinuous hexagonal mesh structure. The selective breaks had a length less than 10 µm. The breaks were designed and estimated to be approximately 5 µm. In order to reduce their visibility, it found that, preferably, the breaks should be less than 10 µm, more preferably, 5 µm or less, e.g., between 1 and 5 µm. Each mesh structure of region 722 and 724 had 97% to 99% open area. Each line segment measured from 2 to 3 nm.

Formation of a Projected Capacitive Touch Screen Sensor Element

The first and second patterned substrates made above were used to produce a two-layer projected capacitive touch screen transparent sensor element as follows.

The first and second patterned substrates were adhered together using Optically Clear Laminating Adhesive 8141 from 3M Company, St. Paul, Minn. to yield a multilayer construction. A handheld roller was used to laminate the two patterned substrates with the regions of the first and second conductive trace regions 706 and 726 being adhesive free. The multilayer construction was laminated to a 0.7 mm thick float glass using Optically Clear Laminating Adhesive 8141 such that the first side of the first substrate was proximate to the float glass. The adhesive free first and second conductive trace regions 706 and 726 allowed electrical connection to be made to the first and second patterned substrates 700 and 720.

FIG. 17 shows a top plan view of a multilayer touch screen sensor element 740 where the first and second patterned substrate have been laminated. Region 730 represented the overlap of the first and second continuous regions. Region 732 represented the overlap of the first continuous region and the second discontinuous region. Region 734 represented the overlap of the second continuous region and the first discontinuous region. And, region 736 represented the overlap between the first and second discontinuous regions. While there was a plurality of these overlap regions, for ease of illustration, only one region of each has been depicted in the figure.

The integrated circuits used to make mutual capacitance measurements of the transparent sensor element were PIC18F87J10 (Microchip Technology, Chandler, Ariz.), AD7142 (Analog Devices, Norwood, Mass.), and MM74HC154WM (Fairchild Semiconductor, South Portland, Me.). The PIC18F87J10 was the microcontroller for the system. It controlled the selection of sensor bars which MM74HC154WM drives. It also configured the AD7142 to make the appropriate measurements. Use of the system included setting a number of calibration values, as is known in the art. These calibration values can vary from touch screen to touch screen. The system could drive 16 different bars and the AD7142 can measure 12 different bars. The configuration of the AD7142 included selection of the number of channels to convert, how accurately or quickly to take measurements, if an offset in capacitance should be applied, and the connections for the analog to digital converter. The measurement from the AD7142 was a 16 bit value representing the capacitance of the cross point between conductive bars in the matrix of the transparent sensor element.

After the AD7142 completed its measurements it signaled the microcontroller, via an interrupt, to tell it to collect the data. The microcontroller then collected the data over the SPI port. After the data was received, the microcontroller incremented the MM74HC154WM to the next drive line and cleared the interrupt in the AD7142 signaling it to take the next set of data. While the sampling from above was constantly running, the microcontroller was also sending the data to a computer with monitor via a serial interface. This serial interface allowed a simple computer program, as are known to those of skill in the art, to render the raw data from the AD7142 and see how the values were changing between a touch and no touch. The computer program rendered different color across the display, depending on the value of the 16 bit value. When the 16 bit value was below a certain value, based on the calibration, the display region was rendered white. Above that threshold, based on the calibration, the display region was rendered green. The data were sent asynchronously in the format of a 4 byte header (0xAAAAAAAA), one byte channel (0x00-0x0F), 24 bytes of data (represents the capacitive measurements), and carriage return (0-x0D).

Results of Testing of the System

The transparent sensor element was connected to the touch sensor drive device. When a finger touch was made to the glass surface, the computer monitor rendered the position of touch that was occurring within the touch sensing region in the form of a color change (white to green) in the corresponding location of the monitor. When two finger touches were made simultaneously to the glass surface, the computer monitor rendered the positions of touches that were occurring within the touch sensing region in the form of a color change (white to green) in the corresponding locations of the monitor. When three finger touches were made simultaneously to the glass surface, the computer monitor rendered the positions of touches that were occurring within the touch sensing region in the form of a color change (white to green) in the corresponding locations of the monitor.

Thus, embodiments of the METHODS OF PATTERNING A CONDUCTOR ON A SUBSTRATE are disclosed. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A two-dimensional self-assembled monolayer (SAM) pattern, comprising:
   a low density region measuring at least 5 square millimeters and comprising a two-dimensional mesh of first SAM features having an average area density value of first SAM features between 0.5% to 20%, wherein the first SAM features have a width value between 0.5 to 25 micrometers, a distance value between adjacent first SAM features of less than 1 millimeter; and
   a second SAM feature measuring at least 50 micrometers in width, wherein for a junction formed between the first SAM features and the second SAM feature, the first SAM features width is widened by tapering before making contact to the second SAM feature.

2. The two-dimensional self-assembled monolayer (SAM) pattern of claim 1 disposed on a patterned metal layer.

3. The two-dimensional self-assembled monolayer (SAM) pattern of claim 1, wherein the two-dimensional mesh of first SAM features has an average area density value between 0.5% to 10%.

4. The two-dimensional self-assembled monolayer (SAM) pattern of claim 1, wherein the two-dimensional mesh of first SAM features has an average area density value between 0.5% to 5%.

5. The two-dimensional self-assembled monolayer (SAM) pattern of claim 1, wherein the SAM comprises octadecylthiol.

6. The two-dimensional self-assembled monolayer (SAM) pattern of claim 1, wherein the low density region has a uniform average area density value of first SAM features.

* * * * *